US011271255B2

(12) United States Patent
Vickery et al.

(10) Patent No.: US 11,271,255 B2
(45) Date of Patent: Mar. 8, 2022

(54) SYSTEMS FOR MANAGING BATTERIES AND ASSOCIATED METHODS

(71) Applicant: Gogoro Inc., Hong Kong (CN)

(72) Inventors: Daniel Vickery, Ipswich, MA (US); Yun-Chun Lai, Hsinchu (TW); Sheng-Chin Chuang, New Taipei (TW); I-Fen Shih, New Taipei (TW); Chien-Chung Chen, Taoyuan (TW)

(73) Assignee: Gogoro Inc., Hong Kong (CN)

( * ) Notice: Subject to any disclaimer, the term of this patent is extended or adjusted under 35 U.S.C. 154(b) by 303 days.

(21) Appl. No.: 16/236,091

(22) Filed: Dec. 28, 2018

(65) Prior Publication Data

US 2019/0207267 A1 Jul. 4, 2019

Related U.S. Application Data

(60) Provisional application No. 62/612,204, filed on Dec. 29, 2017, provisional application No. 62/612,214, filed on Dec. 29, 2017.

(51) Int. Cl.
*H01M 10/42* (2006.01)
*G01R 31/3842* (2019.01)
(Continued)

(52) U.S. Cl.
CPC .......... *H01M 10/425* (2013.01); *B60L 50/66* (2019.02); *B60L 53/00* (2019.02); *B60L 53/66* (2019.02);
(Continued)

(58) Field of Classification Search
CPC .......... H01M 10/443; H01M 10/4207; H01M 10/625; H01M 10/635; H01M 2010/4271;
(Continued)

(56) References Cited

U.S. PATENT DOCUMENTS

2007/0188130 A1 8/2007 Scheucher
2009/0198372 A1* 8/2009 Hammerslag ............ G07F 7/06
700/226
(Continued)

FOREIGN PATENT DOCUMENTS

CN 105493378 A 4/2016
EP 2230142 A1 * 9/2010 .............. B60L 50/40
(Continued)

OTHER PUBLICATIONS

European Search Report received for co-pending EP Patent Application No. 20151620.0 Applicant: Gogoro Inc., dated Apr. 3, 2020, 6 pages.
(Continued)

*Primary Examiner* — M Baye Diao
(74) *Attorney, Agent, or Firm* — Perkins Cole LLP

(57) ABSTRACT

The present disclosure relates to methods and associated systems for providing two energy storage devices positioned in a device-exchange station. The method includes, for example, (1) receiving a request for retrieving two energy storage devices in the device-exchange station; (2) selecting a first energy storage device from a plurality of energy storage devices positioned in the device-exchange station based on characteristic information of each of the energy storage devices; (3) selecting a second energy storage device from the rest of the plurality of energy storage devices positioned in the device-exchange station based on the characteristic information of the first energy storage device and the rest of the plurality of energy storage devices; and (4) releasing the first and second energy storage device.

18 Claims, 14 Drawing Sheets

(51) Int. Cl.
  B60L 50/60 (2019.01)
  H01M 10/625 (2014.01)
  H01M 10/635 (2014.01)
  H02J 7/00 (2006.01)
  B60L 53/68 (2019.01)
  B60L 58/13 (2019.01)
  B60L 58/26 (2019.01)
  B60L 53/80 (2019.01)
  B60L 53/00 (2019.01)
  B60L 53/66 (2019.01)
  B60S 5/06 (2019.01)
  B60L 58/27 (2019.01)
  H01M 10/44 (2006.01)

(52) U.S. Cl.
  CPC ............. B60L 53/68 (2019.02); B60L 53/80 (2019.02); B60L 58/13 (2019.02); B60L 58/26 (2019.02); B60L 58/27 (2019.02); B60S 5/06 (2013.01); G01R 31/3842 (2019.01); H01M 10/443 (2013.01); H01M 10/625 (2015.04); H01M 10/635 (2015.04); H02J 7/0021 (2013.01); H02J 7/0027 (2013.01); *B60L 2240/545* (2013.01); *B60L 2240/547* (2013.01); *B60L 2240/549* (2013.01); *H01M 2010/4271* (2013.01)

(58) Field of Classification Search
  CPC ..... G01R 31/3842; Y02E 60/10; Y02T 90/12; Y02T 10/7072; Y02T 10/70; Y02T 90/167; Y02T 90/16; Y02T 90/14; H02J 7/00; B60L 58/12; B60L 53/68; B60L 58/13; B60L 53/80; B60L 50/66; B60L 2240/545; B60L 2240/547; B60L 2240/549; B60Y 2200/91

USPC .......................................................... 320/109
  See application file for complete search history.

(56) References Cited

U.S. PATENT DOCUMENTS

| | | | |
|---|---|---|---|
| 2012/0176081 A1* | 7/2012 | Schaefer | H02J 7/0013 320/103 |
| 2012/0206093 A1 | 8/2012 | Schaefer et al. | |
| 2013/0030581 A1 | 1/2013 | Luke et al. | |
| 2015/0149015 A1* | 5/2015 | Nakano | B60L 53/80 701/22 |
| 2019/0207268 A1* | 7/2019 | Lai | H01M 10/482 |
| 2019/0207397 A1* | 7/2019 | Lai | B60L 53/80 |
| 2019/0207398 A1* | 7/2019 | Shih | G01R 31/382 |

FOREIGN PATENT DOCUMENTS

| | | | | |
|---|---|---|---|---|
| EP | 2724886 A1 | 4/2014 | | |
| EP | 2737600 A2 | 6/2014 | | |
| EP | 3506454 A1 * | 7/2019 | .......... | H01M 10/425 |
| KR | 20130044166 A | 5/2013 | | |
| WO | 2013016570 A1 | 1/2013 | | |

OTHER PUBLICATIONS

European Search Report received for European Patent Application No. 18248290.1; Applicant: Gogoro Inc., dated Jun. 14, 2019, 4 pages.

Notice of Publication received for co-pending Philippines Patent Application No. PHI-2019-000004; Applicant: Gogoro Inc., dated Aug. 22, 2019, 3 pages.

Office Action received for Taiwan Patent Application No. TW107147511; Applicant: Gogoro Inc., dated Sep. 3, 2019, 11 pages.

* cited by examiner

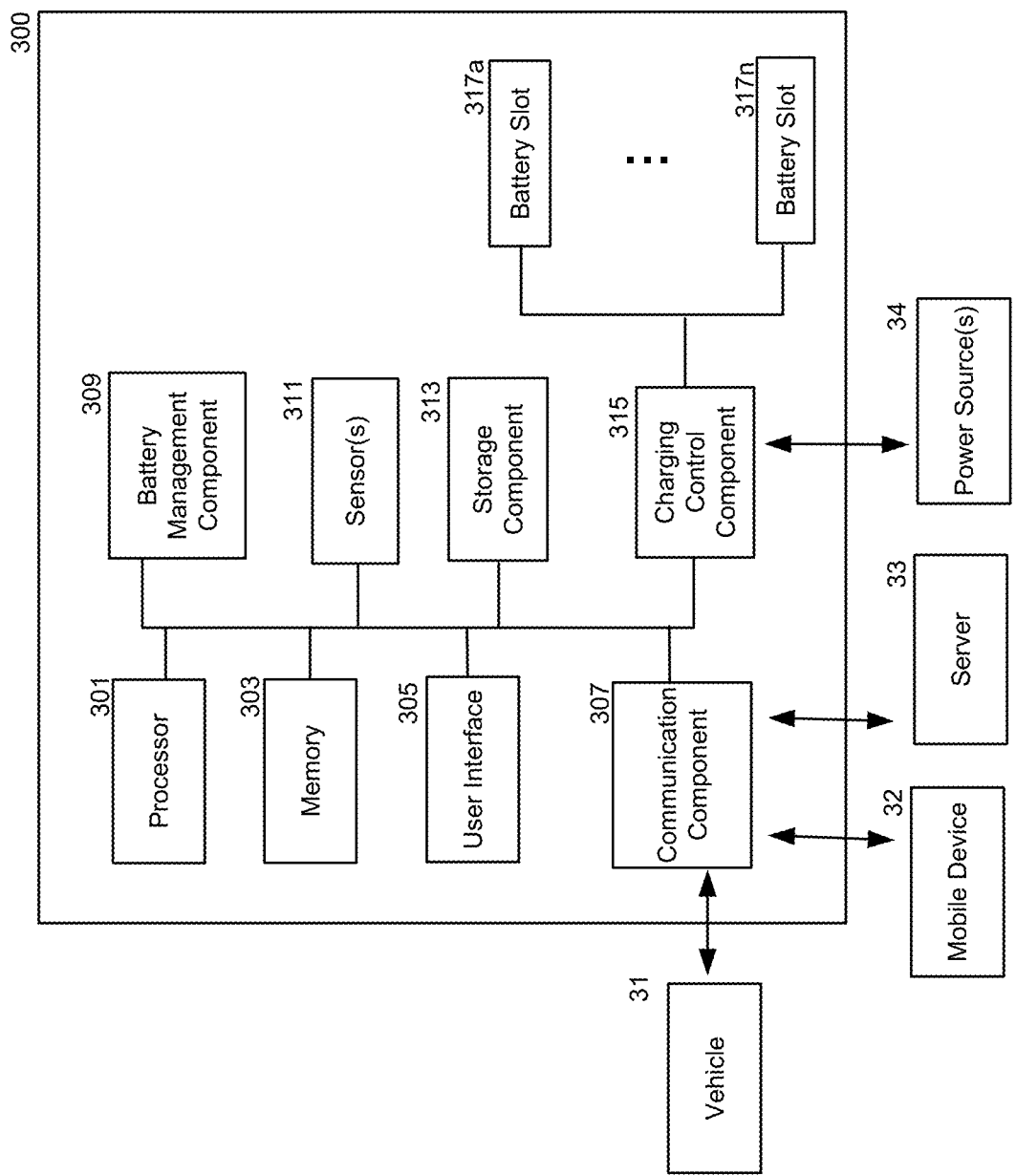

SYSTEMS FOR MANAGING BATTERIES AND ASSOCIATED METHODS

CROSS-REFERENCE TO RELATED APPLICATION

The present application claims the benefit of and priority to U.S. Provisional Applications No. 62/612,204, filed Dec. 29, 2017, and No. 62/612,214, filed Dec. 29, 2017, which are incorporated herein by reference in their entireties.

TECHNICAL FIELD

The present technology is directed to systems and methods for managing energy storage devices in a device-exchange station. More particularly, the present technology is directed to systems and methods for preparing/maintaining an exchangeable energy storage device positioned in a device-exchange station by adjusting one or more characteristics (e.g., temperature, state of charge (SoC), etc.) of the energy storage device.

BACKGROUND

For devices or vehicles that use multiple batteries as their power sources, the characteristics of the multiple batteries can affect the overall system efficiency. For example, using a fully-charged battery together with a depleted battery can result in energy inefficiency (e.g., the performance of the fully-charged battery decreases compared to its normal performance) or battery life shortening. Also, charging temperature can affect a rechargeable battery's characteristics. For example, charging a battery at an excessively high temperature can negatively impact the battery's life span, performance, or charging behavior. Therefore, it is advantageous to have an improved system and method to address the foregoing issues.

BRIEF DESCRIPTION OF THE DRAWINGS

Embodiments of the disclosed technology will be described and explained through the use of the accompanying drawings.

FIG. 3 is a schematic diagram illustrating a battery-exchange station system in accordance with an embodiment of the disclosed technology.

Figure 1A:
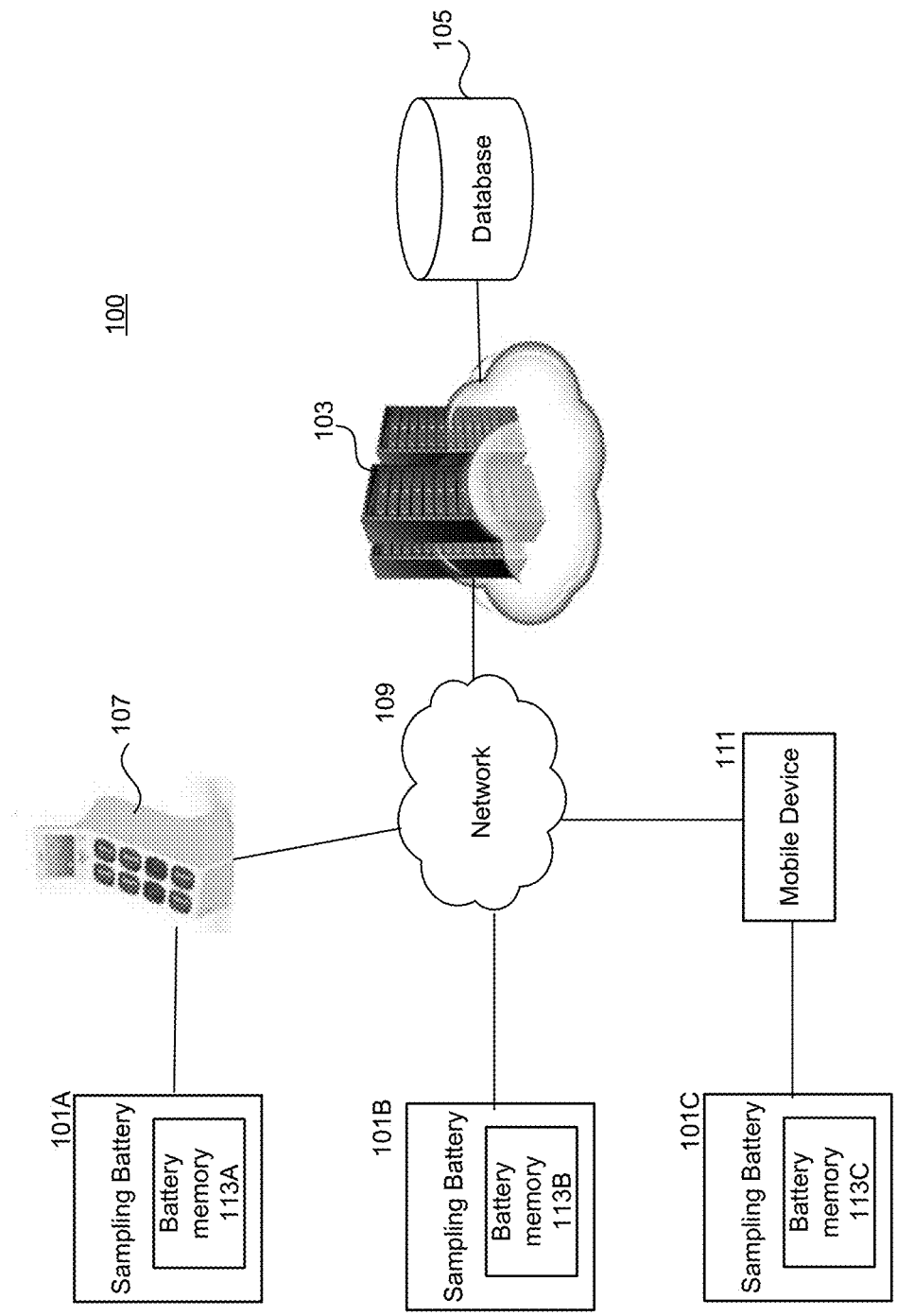
FIG. 1A is a schematic diagram illustrating a system in accordance with an embodiment of the disclosed technology. The system is configured to collect information from multiple sampling batteries.

The drawings are not necessarily drawn to scale. For example, the dimensions of some of the elements in the figures may be expanded or reduced to help improve the understanding of various embodiments. Similarly, some components and/or operations may be separated into different blocks or combined into a single block for the purposes of discussion of some of the embodiments. Moreover, although specific embodiments have been shown by way of example in the drawings and described in detail below, one skilled in the art will recognize that modifications, equivalents, and alternatives will fall within the scope of the appended claims.

DETAILED DESCRIPTION

In this description, references to "some embodiments," "one embodiment," or the like, mean that the particular feature, function, structure or characteristic being described is included in at least one embodiment of the disclosed technology. Occurrences of such phrases in this specification do not necessarily all refer to the same embodiment. On the other hand, the embodiments referred to are not necessarily mutually exclusive.

The present disclosure relates to a method and system for managing two or more energy storage devices (e.g., batteries) positioned in an energy storage station (e.g., a battery-exchange station). The disclosed system prepares, charges, and/or maintains the two or more energy storage devices such that these devices have one or more similar conditions/characteristics (e.g., temperature, state of charge (SoC), other suitable characteristics, etc.) when they are presented to a user (e.g., a battery-exchange plan subscriber, a rental user for temporary use, etc.). Grouping or pairing the energy storage devices with similar conditions/characteristics is beneficial to the user at least because, without wishing to be bound by theory, these energy storage devices provide stable, expected performance and accordingly enhance overall user battery experience. In some embodiments, having energy storage devices with similar conditions or characteristics to operate together can lessen the likelihood of mitigate an unexpected battery failure or life span shortening.

The present disclosure relates to methods for providing two energy storage devices positioned in a device-exchange station. The method includes, for example, (1) receiving a request for retrieving two energy storage devices in the device-exchange station; (2) selecting a first energy storage device from a plurality of energy storage devices positioned in the device-exchange station based on characteristic information of each of the energy storage devices; (3) selecting a second energy storage device from the rest of the plurality of energy storage devices positioned in the device-exchange station based on the characteristic information of the first energy storage device and the rest of the plurality of energy storage devices; and (4) releasing the first and second energy storage devices. For example, embodiments regarding providing two energy storage devices are discussed below with reference to FIGS. 2A-2C and FIG. 8. In some embodiments, the method for providing two energy storage devices is usually implemented when the device-exchange station has to decide to provide which energy storage devices to a user in a short period of time (and accordingly the station probably does not have much time to further charge these energy storage devices). Therefore, the embodiments discussing charging profiles/curves/patterns (e.g., as shown in FIGS. 5A-5D) are used to prepare the energy storage devices prior to (e.g., two hours before a predicted demand for exchanging an energy storage device) providing the same.

In some embodiments, the characteristic information includes a state of charge (SoC), battery type, a cell type, a casing type, physical location, a distance, a firmware version and/or a temperature associated with the energy storage devices. In some embodiments, the first energy storage device has a first SoC (e.g., 91%), and the second energy storage device has a second SoC (e.g., 94%). An SoC difference (e.g., 3%) between the first and second SoCs is smaller than an SoC threshold (e.g., 5%). In some embodiments, the method can select an energy storage device with a highest SoC as the first device, and then select another energy storage device with the same or similar SoC as the second device. For example, the SoC difference between the first device and the selected second device is the smallest among the rest of the energy storage devices positioned in the device-exchange station. By this arrangement, the disclosed system can provide similar energy storage devices to a user.

In some embodiments, before the disclosed system releases the two selected energy storage devices, the system can verify whether the SoCs of the two batteries are lower than an SoC threshold (e.g., 90%) and then the system only provides the user with the energy storage devices having SoCs higher than the SoC threshold (or two energy storage devices having the smallest SoC difference). In some embodiments, the system also checks whether the temperatures of the two batteries are lower than a temperature threshold (e.g., 40 degrees Celsius). This approach enhances user's experiences (e.g., if an energy storage device is too hot or has a low SoC, it may not function properly).

In some embodiments, the temperature threshold can be adjusted based on an ambient temperature of the device-exchange station. For example, if the device-exchange station has a lower ambient temperature, the temperature threshold can be higher since the energy storage device can be cooled down by the ambience during operation. In some embodiments, the temperature threshold can be adjusted based on a location of the device-exchange station. For example, if a station is located at a side of a flat road, the temperature threshold can be higher (e.g., a user probably does not need to ride uphill, which results in a higher energy storage device temperature). For example, if a station is located at an area where station density is high (e.g., having more stations in per unit area than other areas), the temperature threshold can be higher (e.g., it's easier and more convenient for a user to swap energy storage devices in this area, so it should be fine to provide energy storage device with a higher temperature to the user).

In some embodiments, the system can adjust the temperature threshold based on information associated with a user profile, such as addresses, frequent routes, user preferences, user driving/riding histories/behavior/habits, demographic information including gender, age, race, etc. For example, the threshold temperature can be higher if the information associated with a user profile indicates that the user can ride/drive in a short range.

In some embodiments, the second device can be selected by determining whether the first and the second energy storage devices have at least one factor in the characteristic information in common. For example, the at least one factor in the characteristic information can include a manufacturer identifier, a manufacturing time, and/or a health index (e.g., an internal resistance of a battery, number of actual charging cycles, etc.).

In some embodiments, the characteristic information can include a plurality of factors associated with the plurality of energy storage devices positioned in the device-exchange station (e.g., factors regarding battery manufacturing information, battery basic characteristics, and/or battery usage, as discussed in detail below). The disclosed method can include (1) determining priorities (or weighting values) of the plurality of factors based on a user request (or a user profile); and (2) selecting the first and second energy storage devices at least partially based on the priorities (or the weighting values). For example, a user can send a request to the system asking to reserve a pair of "high-performance" batteries. The system can then assign batteries manufactured by Company X (who manufactures high performance batteries) a high priority (or assign batteries whose battery cells inside are manufactured by Company X). Similarly, the system can then assign batteries with high SoCs and low temperature a high priority. As a result, the system can provide suitable energy storage devices to a user based on his/her request.

As described herein, the energy storage devices are portable devices that can be used to store energy (e.g., electric power) and provide the stored energy when appropriate. Examples of energy storage devices include batteries. The term "energy storage device" and "battery" are used interchangeably in this disclosure. In some embodiments, the disclosed system can be implemented by a battery-exchange station. The disclosed system is configured to accommodate, charge, and maintain multiple exchangeable batteries for users to exchange. The exchangeable batteries can be used for powering vehicles, mobile devices, etc. The exchangeable batteries can also be used to provide power to households or places that do not have sufficient mains electricity coverage. When using the exchangeable batteries to power the vehicles, one than one batteries may be used at the same time. In this disclosure, although the demands for two batteries are discussed, the present disclosure can include embodiments that involve more than two exchangeable batteries.

There are several ways that the battery-exchange station can determine what kind of batteries are desirable/suitable for a user. First, the battery-exchange station can determine based on information associated with a user profile (e.g., stored in a server, and the station can have such information when the server notifies the station that the user reserves or requests two batteries in the station) or directly from a user (e.g., by receiving a request from a user's mobile device via a wireless communication). Second, the battery-exchange station can determine by analyzing an inserted battery from the user. For example, the battery-exchange station can first analyze a first battery when it is inserted in the battery-exchange station. By pulling information from a memory associated with (e.g., attached to) the first battery, the disclosed system knows the identity, the characteristics, and usage history of the first battery. Based on the received information from the first battery, the disclosed battery-exchange station identifies a second battery in the battery-exchange station to be paired with the first battery.

For example, the disclosed system can determine battery characteristic information (e.g., one or more battery characteristics) such as: the first battery is a type A1 battery (e.g., made by manufacture M1, having hardware version V1, with battery cell C1 at cell temperature CT1, having a 20% SoC, having a battery full charge capacity FCC1, having experienced 10 charging cycles, having an expected life span of 1000 charging cycles, etc.). Based on a set of reference information (e.g., a set of characteristic information including factors collected from multiple sampling batteries, to be discussed in detail with reference to FIGS. 1A, 1B, 5A-5D below) stored in the system, the disclosed system identifies a second battery in the system to be paired with the first battery.

In some embodiments, the second battery can be a type A2 battery (e.g., made by manufacturer M2, having hardware version V1, with battery cell C2 at cell temperature CT2, having a 30% SoC, having a battery full charge capacity FCC1, having experienced 20 charging cycles, having an expected life span of 1000 charging cycles, etc.) that has characteristic information similar to the first battery. In some embodiments, the second battery can be another type A1 battery with minor differences (e.g., having a 23% SoC, having experienced 12 charging cycles, etc.).

In some embodiments, a battery management plan for both the first and second batteries is determined based on a battery demand prediction or a user reservation. For example, the disclosed system expects an increase in battery demand in 3 hours (e.g., preparation time period) and accordingly the system generates the battery management plan to meet this battery demand. Accordingly, the disclosed system can instruct a charging control component of the battery-exchange station to charge the first and second exchangeable batteries (e.g., individual charging plans for the two batteries can be different).

In some embodiments, the disclosed system can manage batteries in different battery stations. More particularly, the disclosed system enables a system operator to perform a 'battery location optimization" process by moving the batteries in the system close to similar ones. For example, the disclose system can motivate battery users to move batteries between different stations. In such embodiments, the system can provide incentives (e.g., offering a lower rate for exchanging batteries at one station and/or a higher rate for exchanging batteries at another station) to battery users to encourage the users to move certain types of batteries to particular battery-exchange stations. In some embodiments, the system operator can send a battery delivery crew to move batteries among stations during off-peak hours (e.g., 1-4 a.m., which may vary for different stations). By performing this battery location optimization process, the overall system energy efficiency is improved (e.g., battery life span is not reduced due to operating dissimilar battery pairs together) and user battery experiences are enhanced (e.g., battery performance is not compromised due to operating dissimilar battery pairs together). In some embodiments, the system can use user's historical routes to move batteries between different stations. For example, the system can determine that user X usually picks up two batteries at station Y1 at 9 a.m. and return these batteries at station Y2 at 10 p.m. on the same day. In this example, the system can provide user X incentives to move batteries from station Y1 to station Y2.

Another aspect of the disclosed system is that it provides a battery memory attached to a rechargeable battery managed by the system. The battery memory stores characteristic information including one or more factors of battery (e.g., battery manufacturers, battery hardware/firmware versions, expected battery operating/charging temperatures, actual battery operating/charging temperatures, battery state of charge SoC, battery full charge capacity FCC, battery usage, expected life spans, etc.) of the rechargeable battery that is constantly or periodically monitored or measured (e.g., by a sensor of a vehicle, in a battery charging station, or attached to the battery). The measured characteristic information can be transmitted to the system for further analysis or processing. In some embodiments, the measured battery information can be transmitted to a server of the system through a mobile device (e.g., user's smartphone), a battery charging/exchange station, or a vehicle via a network. In some embodiments, the system can pull the measured battery temperature information directly from the battery memory (e.g., when the rechargeable battery is sent back to a factory for maintenance, repair, firmware update, etc.).

Another aspect of the disclosed system is that it provides a system to (1) collect and analyze characteristic information from multiple sampling batteries and (2) generate reference information accordingly. In some embodiments, the characteristic information of the batteries can be collected and stored in a server. In some embodiments, the characteristic information of a battery can be stored in a memory attached to that battery. In some embodiments, the characteristic information of the batteries can be collected and stored in a battery-exchange station. The present system can first collect the measured characteristic information from multiple sampling batteries. In some embodiments, the sampling batteries can include rechargeable/exchangeable batteries that are currently deployed for users to exchange. For example, the sampling batteries can include batteries that have been used by a user (e.g., a battery plan subscriber) to power the user's electric vehicle. In some embodiments, the sampling batteries can include batteries not yet on the market (e.g., those are tested or stored in factories, warehouses, laboratories, etc.). In some embodiments, the disclosed system can collect information from multiple sources (e.g., battery-exchange stations, electric vehicles, batteries, user mobile devices, etc.). In some embodiments, the disclosed system can collect information from a database. The disclosed system then analyzes the collected characteristic information of the batteries and accordingly generates a set of reference information. For example, the present system can categorize the collected battery information based on multiple factors such as, (1) battery manufacturing information, (2) battery basic characteristics, and (3) battery usage.

Examples of the battery manufacturing information can include the identity of the battery manufacturer or battery cell manufacturer (e.g., batteries or battery cells made by different manufacturers may have different characteristics, although their battery specifications may be the same), manufacturing dates (e.g., batteries made on different dates may have different characteristics), manufacturing batches (e.g., batteries made in different batches may still have different characteristics), battery hardware/firmware versions, and/or manufacturing serial numbers (e.g., individual batteries can have different characteristics).

Examples of the battery basic characteristics include a battery capacity (e.g., full charge capacity, FCC), a battery discharging capacity (e.g., how much power can a battery provide under certain conditions), battery cell types (e.g., lithium-ion (Li-ion), nickel-cadmium (NiCd), nickel-zinc (NiZn), nickel metal hydride (NiMH), etc.), battery direct current internal resistance (DCIR), battery casing shapes (e.g., cylinder, hem icube, cube, cuboid, etc.), and/or a suggested battery working temperature (e.g., a temperature range such as 5 to 35 degrees Celsius, including a maximum and/or minimum battery cell temperature and a battery circuit temperature). Other examples of the battery basic characteristics can include a suggested battery charging temperature (e.g., a temperature range such as 25 to 40 degrees Celsius), a suggested battery charging current (e.g., a constant or regulated current), a suggested battery charging voltage (e.g., a constant or regulated voltage), a suggested battery charging cycle (e.g., at least one full charging per week), a suggested battery charging speed (e.g., increasing 10% state of charge, SoC, of a battery in 5 minutes), a suggested full charge point (e.g., 98% of its FCC), a suggested battery charging time (e.g., not to be continuously charged for more than 5 hours), and/or a suggested charge profile of applied amount versus time.

Examples of other factors of batteries (e.g., factors regarding battery usage) include an actual battery charging temperature history (e.g., a battery was charged yesterday at 30 degrees Celsius and at 35 degrees Celsius earlier today for 25 minutes), an actual battery charging current (e.g., 1-200 Amperes), an actual battery charging voltage (e.g., 1-220 volts), an actual battery charging cycle (e.g., a battery has been through 50 full charge cycles and 125 partial cycles), an actual battery charging speed or charging rate (e.g., 20 Amperes for an hour), an actual battery charging time (e.g., a battery was charged for 56 minutes yesterday), an actual battery working temperature (e.g., a battery was operating at 35 degrees Celsius yesterday for 2 hours), and an actual battery discharging time (e.g., a battery was discharged at its full current capacity for 66 minutes yesterday).

Through analyzing the collected characteristic information of batteries versus one or more of the multiple factors mentioned above, the present system establishes a set of reference information that enables the system operator to understand how to manage (e.g., control the battery temperature or other characteristics of) a particular type of rechargeable battery during different stages (e.g., charging, discharging, idling, etc.) to achieve an objective or goal. For example, based on the analysis, the present technology can generate a customized battery management (e.g., charging) plan that can maintain the maximum capacity of a particular type of battery as long as possible. As another example, the present technology can generate a customized battery management plan that can increase/maximize the life span of a type of battery. In some embodiments, the present technology can generate a customized battery management plan that enables a specific type of battery to have a maximum number of charging cycles (e.g., after 500 charging cycles, the battery can still have 90% of its original capacity). In some embodiments, 90% can be defined as an SoC threshold. Batteries with SoCs lower than the SoC threshold are considered "locked" or "not exchangeable" so as to ensure acceptable user experience. In other embodiments, the present technology can have other types of suitable objectives (e.g., battery management plans selected to increase customer satisfaction, battery performance, user experience, etc.). The foregoing objectives or goals can also be achieved when the disclosed system prepares batteries with similar characteristics (e.g., the first and second battery discussed above).

Figure 5A:
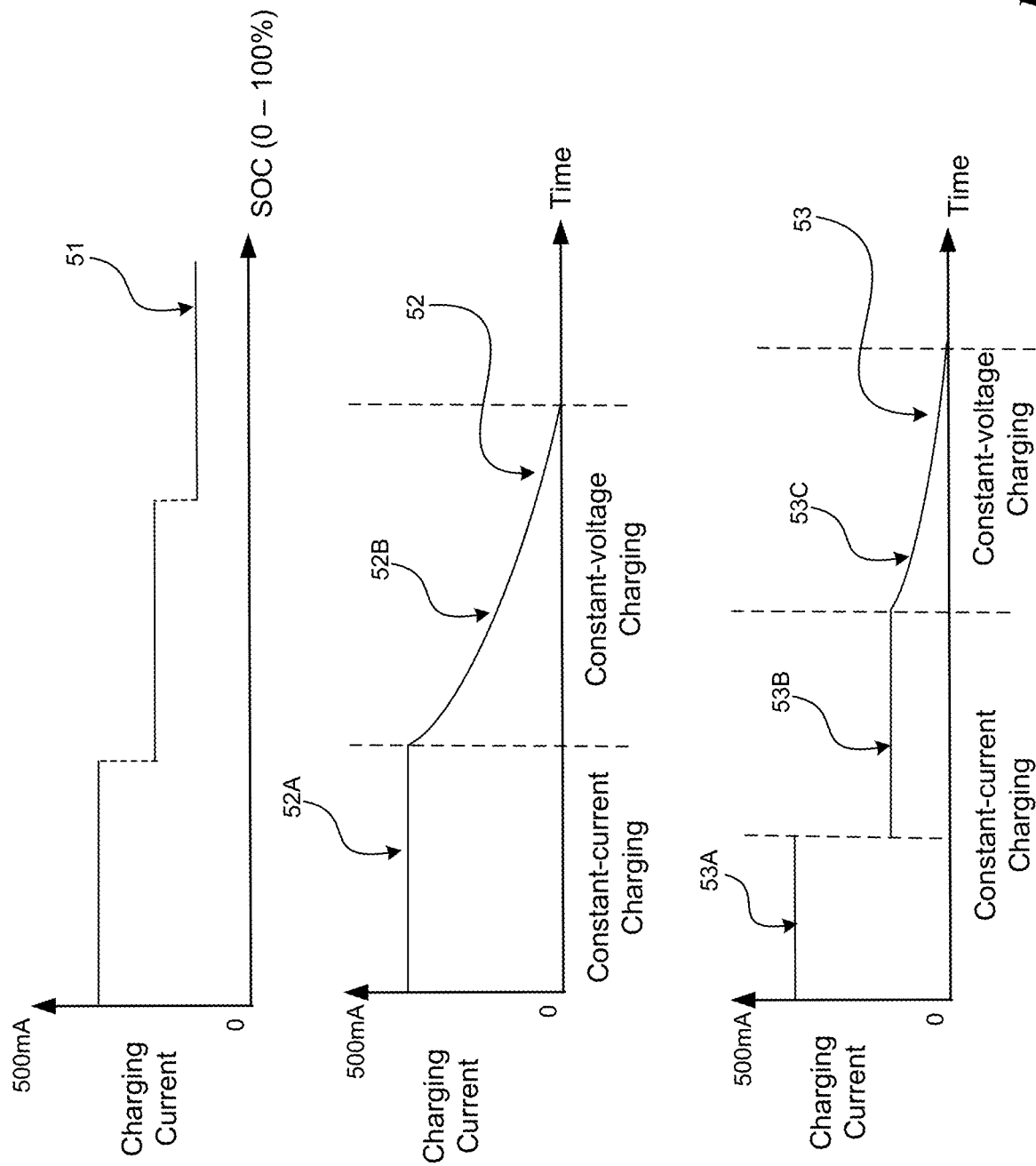
FIGS. 5A-5C are graphs illustrating battery charging characteristics or patterns in accordance with an embodiment of the disclosed technology.
Figure 5B:
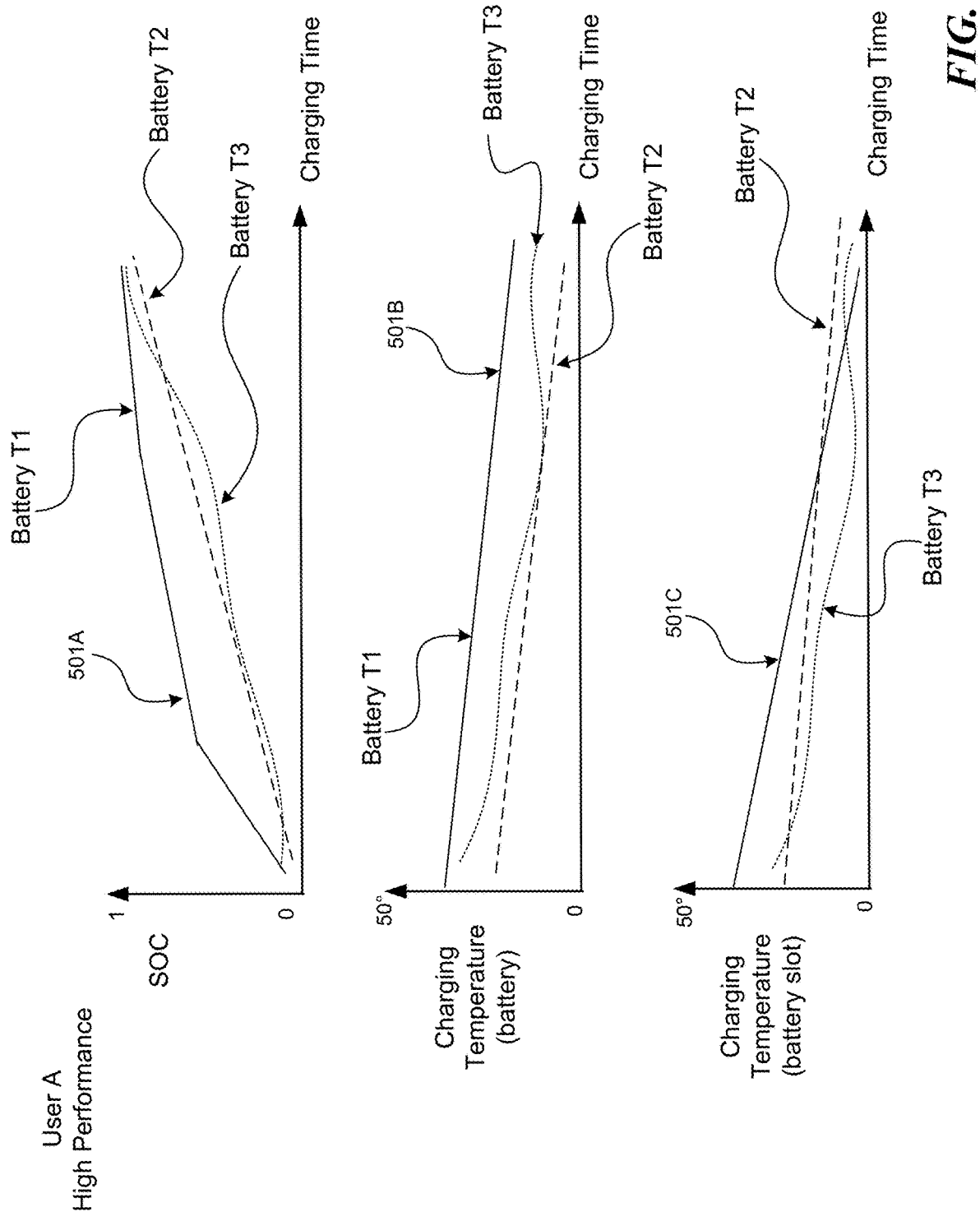
Figure 5C:
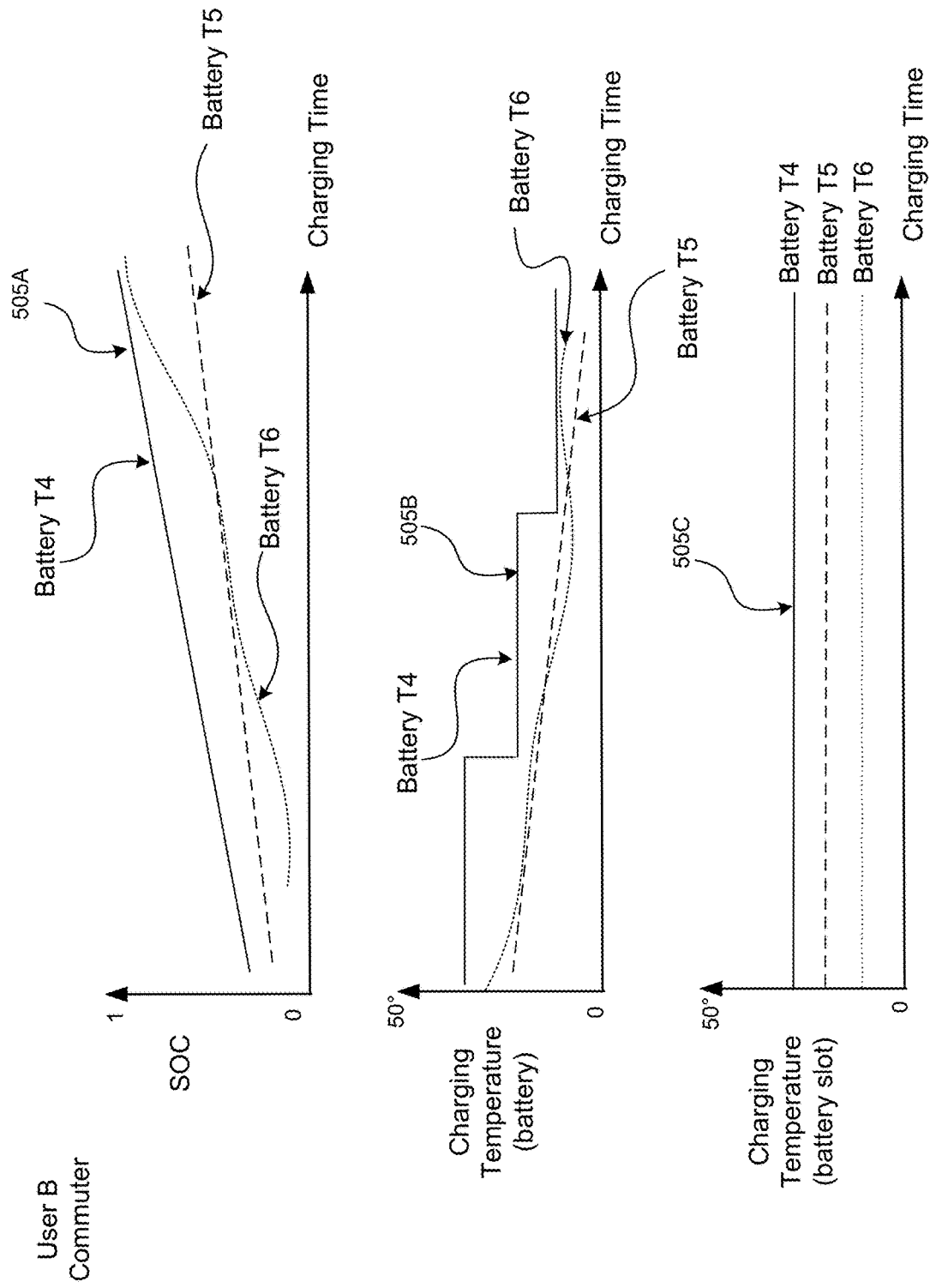
Figure 5D:
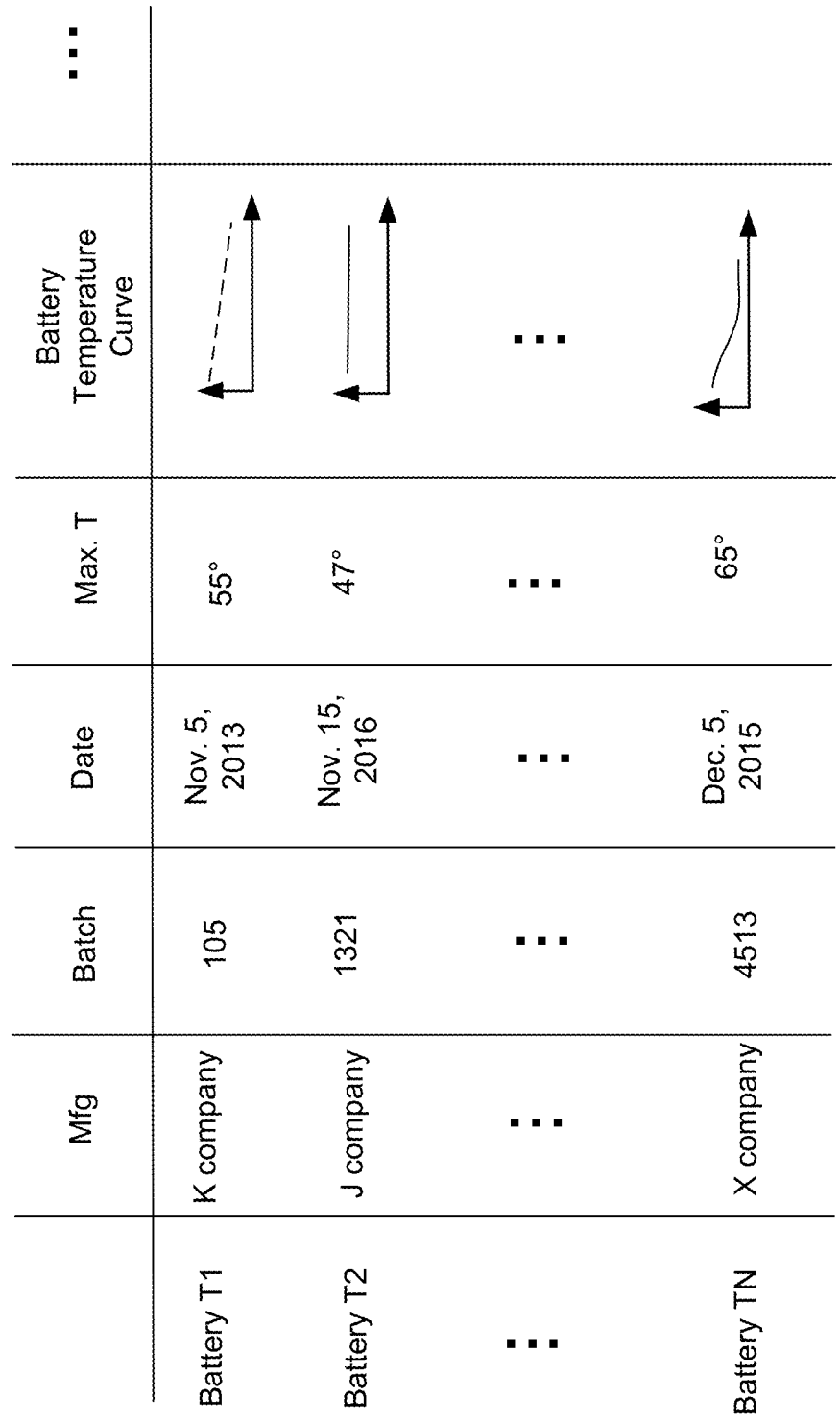
FIG. 5D is a table illustrating battery characteristics or patterns in accordance with an embodiment of the disclosed technology.

In some embodiments, a customized battery management plan in forms of characteristic curves/lines (e.g., as shown in FIGS. 5A-5C). In some embodiments, the customized battery management plan in forms of characteristic tables (e.g., as shown in FIG. 5D).

In some embodiments, the present technology can further customize the battery management plan by considering user behavior. In some embodiments, the present system can further analyze user driving/riding habits and accordingly adjust the battery management plan. For example, a user can be very demanding on battery performance (e.g., a professional racer). For this type of user, the present system can generate a customized battery management plan that results in multiple batteries (e.g., a pair of batteries) with best performance potential (e.g., can discharge a large amount of current intermittently) for the user to use (e.g., enable the user to pick up these batteries at a particular battery charging/exchange station) therefore when such a user requests a battery exchange (or a server having a prediction that the user is going to request for a battery exchange), the charging plan for the batteries to be exchanged by this user is adjusted to meet his/her expectations.

As another example, a user may only use a battery to power their vehicle for daily errands (e.g., picking up children or grocery shopping). For this particular type of user, the present system can generate a customized battery management plan that results in multiple batteries with acceptable performance (e.g., only need to discharge smaller amounts of current continuously) for the user to use. For example, the customized battery management plan can include (1) charging batteries based on their SoCs (e.g., using different charging rates when the SoCs are different); and/or (2) setting the charging characteristics to produce batteries that will have certain types of performance.

Yet another aspect of the present disclosure is to provide a user with a pair (or more) of batteries with similar characteristic information (e.g., within a temperature range, within a battery age range, within a SoC range, etc.) For example, the present system can predict when a user wants to exchange a pair of batteries (e.g., according to the user's reservation or a battery demand prediction performed by the system) at a particular battery charging/exchange station. By this arrangement, when the user comes to the station to pick up the charged batteries, the system can ensure that the pair of batteries to be picked up have similar or the same (or substantially the same) characteristic information. Allowing users access to only those batteries with similar characteristic information not only enhances overall user experience (e.g., the user can be irritated if getting two batteries that appear unmatched), but also improves battery performance.

In some embodiments, the system provides a user with a pair of batteries by not only considering the characteristic information of these batteries but also considering the physical locations/positions of these batteries. For example, if there are more than two batteries with the same or similar characteristics that are available for a user, the system would plan to select two from the available batteries that have the shortest distance (e.g., the selected two batteries can be located in the same battery station or positioned in adjacent battery slots. In some embodiments, the system is allowed to output two batteries only if the distance between two slots where the two batteries are positioned is smaller than a distance threshold (e.g., there are no more than three other batteries between the two batteries). In some other embodiments, the system can perform a similarity matching for all the batteries positioned in the station, and then select/release two similar batteries with the closest distance therebetween. In some embodiments, the selected two batteries can be located adjacent located in two battery racks close or adjacent to each other). In some embodiments, the disclosed system can select the two batteries based on user preferences and profiles. In some embodiments, the system can assign weightings to various factors (e.g., information used for similarity matching, physical locations/distances, etc.) when selecting the two batteries for the user.

Another aspect of the present disclosure is to provide a customized battery management plan in a real-time (e.g., milliseconds to seconds) or near real-time (e.g., minutes to hours) manner. For example, when a user positions a battery in a battery-exchange station, the present system can immediately provide a suitable battery management plan for that battery, for example, how to charge that battery and how to use that battery to meet a demand predicted by a server (e.g., the server can predict that there will be a demand for that battery in next two hours, and accordingly, the system can prepare that battery based on the battery management plan). In some embodiments, the system is configured to further adjust the customized battery management plan based on other factors such as predicted demands of battery (e.g., predicted by a server based on empirical data), charging cost, user requests/reservations, environmental conditions, future or current events, etc.

In one embodiment, a battery management plan is characterized as a charging schedule/profile defined by the levels of voltage and current over time that are applied to the battery during charging as well as other factors such as how hot the battery is allowed to get during charging and what percentage of a full charge is considered to be fully charged. The server is configured to receive information that is stored in an individual battery's memory and determine one or more characteristics of the battery. The information received from the battery is compared with information stored in the database for similar batteries to select an optimum charging battery management plan. For example, batteries used by high performance users may be charged in a manner that increases/maximizes the current that can be drawn from the battery at the expense of expected battery life. The server reads the information stored with the battery and may compare it with other historical information read from other batteries or other information such as from battery manufacturers and the like to develop a customized battery management plan in accordance with the expected use of the battery.

In some cases, the particular creation of a battery management plan is a multi-variable problem selected to achieve a desired characteristic of a battery (e.g. long life, maximum charge capacity, maximum discharge rate, maximum temperature recorded during charging, etc.). In some cases, the desired optimization criteria are specified based on the information read from the battery, from information read from similar batteries, and in other cases it is determined by the type of user who is exchanging the battery. The server can create customized battery management plans for each battery in the fleet that are selected to achieve some desired optimization goal for the battery.

In some embodiments, the server or charging station suggests or only allows a user to select particular batteries from a charging station (such as by locking individual charging slots). A battery that is managed for increased/maximum performance can therefore be given to those users who expect (or pay for) performance batteries.

In another embodiment, the characteristic information read from a battery may indicate that the battery is used only for errands by a non-performance user (or the battery is getting old after experiencing a certain number of charging cycles). In this case, the server can determine a battery management plan for a particular battery by comparing the characteristic information read from the battery with other stored data (from other batteries or other sources) that suggests a particular charging scheme that will increase/maximize battery life. The battery management plan is transmitted to the charging station that implements the plan by controlling how the battery is charged.

As indicated above, in some embodiments, batteries that are expected to be exchanged together are charged according to battery management plans that are selected so that the batteries will have similar characteristics when provided to the user.

In some embodiments, the battery management plan is not only used for charging but can be used to control discharge. For example, a battery management plan can be stored in the memory of the battery and used to control the rate (e.g. maximum current draw) that the battery is allowed to experience. A computer on the vehicle can access the stored battery management plan and set operating parameters of the vehicle so that the requirements of the battery management plan are followed.

Various embodiments of the present technology may provide one or more of the following technological improvements: (1) efficient real-time or near real-time creations of customized battery management plans ready for a battery-exchange station to follow; (2) the ability to effectively increase/maximize battery life spans and performance by providing similar batteries to a user at the same time; (3) the ability to enable an operator to manage batteries in multiple battery-exchange stations based on the similarities of the batteries; and (4) the ability to provide enhanced user experiences by offering satisfying battery experiences in an energy-efficient fashion.

The present disclosure also relates to a method and system for managing the battery temperature of one or more rechargeable batteries positioned in a battery-exchange station. The disclosed system is configured to (1) determine a temperature threshold of the one or more rechargeable batteries; (2) control the temperature of the one or more rechargeable batteries during a battery charging process performed by the battery-exchange station; and (3) select one or more batteries to be provided to a user from the one or more rechargeable batteries. In some embodiments, the temperature threshold can be a temperature range (e.g., 10-45° C., 10-60° C., etc.). By setting the temperature threshold, the disclosed system can provide batteries within the temperature range to a user. It is advantageous to provide batteries with a proper temperature at least because doing so (1) would enhance overall user experience (e.g., the user can be irritated if they receive a "hot" battery), and/or (2) can improve battery performance (e.g., a vehicle may have a strict battery temperature requirement for the vehicle to performed as expected). In some embodiments, the temperature threshold can be considered as a gate-keeper or the last threshold before a station outputting a battery to a user. To meet the temperature threshold, the system can decide not to achieve certain goals such as increasing battery life spans and/or providing similar batteries to the user at the same time, which may lead to a trade-off decision for those goals (e.g., achieve only 80% of the goals so as to pass the temperature threshold before outputting the batteries).

In some embodiments, the temperature threshold can be determined based on one or more factors such as user battery preference, user profile, user history, characteristic information, environmental conditions, predicted user demands, etc. For example, the temperature threshold can be determined based on an ambient temperature surrounding a battery (e.g., the temperature of a battery charging device or station, etc.). When a battery is charged or discharged at an excessively high (e.g., more than 50° C.) or low (e.g., less than 0° C.)

temperature, the characteristics of the battery can be negatively affected or degraded (e.g., its full charge capacity, FCC may decrease, and accordingly the charge/discharge capacity may also decrease). The disclosed system can effectively address this issue by keeping the battery within a predetermined temperature range (e.g., not higher than an upper threshold value, and not lower than a bottom threshold value).

Once the temperature threshold is determined, the disclosed system can accordingly generate a temperature control plan (e.g., including a charging plan that can maintain the battery temperature when charging). The temperature control plan is then implemented to keep the battery temperature within a range defined by the temperature threshold.

In some embodiments, the temperature threshold can be adjusted based on environmental conditions such as an ambient temperature. For example, when a weather forecast indicates that there will be a temperature decrease, the temperature threshold can be set at a temperature higher than a current temperature threshold (e.g., the battery is expected to be cooled down by the ambient environment). Similarly, when a hot weather is expected, the temperature threshold can be set at a temperature lower than the current temperature threshold (e.g., the battery is expected to be heated up by the ambient environment). In some embodiments, the system can be preheated or precooled a battery before it is charged, so as to maintain the battery temperature.

In some embodiments, the temperature threshold can be determined based on user behavior (e.g., user driving/riding habit, battery plan subscriptions, etc.) For example, a standard temperature threshold can be set as 50° C. (which can be set according to empirical studies on characteristic information of batteries such as cell type, internal structure of battery, etc.). For a "high-performance" type user (e.g., a professional racer), the temperature threshold can be set as a temperature lower than 50° C. (e.g., 40-48° C.). For a "grocery-shopping" type of user, the temperature threshold can be set as a temperature higher than 50° C. (e.g., 52-55° C.). For the other users (e.g., a standard type), the temperature threshold can be set as about 50° C. (e.g., 49-51° C.). For different types of users, available batteries can vary (e.g., a fully-charged battery at 52° C. is considered "available" to "grocery-shopping" users, but not to "high-performance" users). The disclosed system can present available characteristic information to users based on their types. In some embodiments, the temperature threshold can be less strict, which makes it easier for a user to receive a (or a pair of) full charged battery (or batteries) during the battery exchange.

In some embodiments, the temperature threshold can be determined based on a predicted battery demand. For example, if a predicted battery demand indicates that a demand for battery of a battery station will surge, the temperature threshold can be set at a temperature higher than a current temperature threshold (e.g., expected charging processes can result in a temperature increase), and vice versa.

In some embodiments, for example, a charging station can have a battery release rule that it only releases a battery to a user when the battery is 90% charged and is lower than 40-50° C. When a predicted battery demand is high, the system can adjust the battery release rule to "88% charged with a temperature lower than 50° C." When the predicted battery demand is low, the system can adjust the battery release rule to "95% charged with a temperature lower than 48° C."

In some embodiments, the temperature threshold can be determined based on characteristic information (e.g., examples of the characteristic information are discussed in detail below). For example, an aged battery can have a higher temperature threshold because its temperature can increase faster than a new battery when charging (e.g., the aged battery may have higher internal resistance/impedance).

In some embodiments, the temperature threshold can be determined based on a combination of various factors mentioned above. In such embodiments, various weighting values can be given to each of the factors. Some factors can be correlated. For example, a "location" factor (e.g., where a battery station is located) can relate to a "weather" factor (e.g., ambient temperature surrounding the battery station can be vary in tropical/temperate/polar zones or in areas with/without shades) or a "battery demand" factor (e.g., a city-type battery station can have a higher battery demand than a non-city-type battery station).

The present technology is also directed to systems and methods for managing the temperature of an exchangeable battery during a charging or a preparation process performed by a battery-exchange station. More particularly, the present system can monitor and control the battery temperature of the rechargeable battery during a charging process performed by a battery charging/exchange station. The present system provides a battery memory attached to a rechargeable battery managed by the system. The battery memory stores the battery temperature of the rechargeable battery that is constantly or periodically monitored or measured (e.g., by a temperature sensor of a vehicle, of a battery charging station, or attached to the battery). The measured battery temperature information can be transmitted to the system for further analysis or process. In some embodiments, the measured battery temperature information can be transmitted to a server of the system through a mobile device (e.g., user's smartphone), a battery charging/exchange station, or a vehicle via a network. In some embodiments, the system can pull the measured battery temperature information directly from the battery memory (e.g., when the rechargeable battery is sent back to a factory for maintenance, repair, firmware update, etc.).

The present system can collect the measured battery temperature information from multiple sampling batteries. In some embodiments, the sampling batteries can include rechargeable/exchangeable batteries that are currently deployed for users to exchange. For example, the sampling batteries can include batteries that have been used by a user (e.g., a battery plan subscriber) to power the user's electric vehicle. In some embodiments, the sampling batteries can include batteries not yet on the market (e.g., those are tested or stored in factories, warehouses, laboratories, etc.). In some embodiments, the disclosed system can collect information from multiple sources (e.g., battery-exchange stations, electric vehicles, batteries, user mobile devices, etc.). In some embodiments, the disclosed system can receive such information from a database.

The present system then analyzes the collected battery temperature information and accordingly generates a set of reference information. For example, the present system can categorize the collected characteristic information based on multiple factors such as (1) battery manufacturing information, (2) battery basic characteristics, and (3) battery usage.

Through analyzing the collected battery temperature information versus the multiple factors mentioned above, the present system establishes a set of reference information that enables the system operator to understand how to control the battery temperature of a particular type of rechargeable battery during different stages (e.g., charging, discharging, idling, etc.) to achieve an objective or goal. For example, based on the analysis, the present technology can generate a customized battery temperature control plan that can maintain the maximum capacity of a particular type of battery as long as possible. As another example, the present technology can generate a customized battery temperature control plan that can increase/maximize the life span of a type of battery. In some embodiments, the present technology can generate a customized battery temperature control plan that enables a specific type of battery to have a maximum number of charging cycles (e.g., after 500 charging cycles, the battery can still have 90% of its original capacity). In other embodiments, the present technology can have other types of suitable objectives (e.g., customer satisfaction, battery performance, user experience, etc.).

In some embodiments, the present technology can store the customized battery temperature control plan in forms of characteristic curves/lines (e.g., as shown in FIGS. 5A-5C). In some embodiments, the present technology can further customize the battery temperature control plan by considering user behavior. In some embodiments, the present system can further analyze user driving/riding habits and accordingly adjust the battery temperature control plan.

For example, a user can be very demanding on battery performance (e.g., a professional racer). For this type of user, the present system can generate a customized battery temperature control plan that results in multiple batteries with the best performance potential (e.g., can discharge a large amount of current intermittently) for the user to use (e.g., enable the user to pick up these batteries at a particular battery charging/exchange station). In some embodiments, the present system can plan to provide this type of user with batteries that have not been charged at a temperature over 50° C. (e.g., to make sure that the batteries can perform as expected). As another example, a user may only use a battery to power its vehicle for daily errands (e.g., picking up children or grocery shopping). For this particular type of user, the present system can generate a customized battery temperature control plan that results in multiple batteries with acceptable performance (e.g., only need to discharge a smaller amount of current continuously) for the user to use. In some embodiments, the present system can plan to provide this type of user with batteries that higher temperature tolerance (e.g., batteries that have been charged from 50° C. to 60° C.). The customized battery temperature control plan can include maintaining the charging temperature based on a characteristic curve/line (e.g., the reference information mentioned above) during a charging process.

Another aspect of the present disclosure is to provide a user with a battery (or a pair or more of batteries) at a specified temperature. For example, the present system can predict when a user wants to exchange a battery (e.g., according to the user's reservation or a battery demand prediction performed by the system) at a particular battery charging/exchange station. Based on the customized battery temperature control plan, the present system can implement the battery temperature control plan during a charging process performed by the particular battery charging/exchange station. By this arrangement, when the user comes to the station to pick up the charged battery, the system can ensure the temperature of the charged battery is within an acceptable temperature range. In some embodiments, vehicle performance may be limited due to high battery temperatures. Therefore, allowing users access to only those batteries with a proper temperature not only enhances overall user experience (e.g., the user can be irritated if they receive a "hot" battery), but also improves battery performance (e.g., the charged battery is ready to perform without any cooling period).

Yet another aspect of the present disclosure is to provide a customized battery temperature control plan in a real-time (e.g., milliseconds to seconds) or near real-time (e.g., minutes to hours) manner. For example, when a user positions a battery in a battery-exchange station, the present system can immediately provide a suitable battery temperature control plan for that battery. In some embodiments, the system is configured to further adjust the customized battery temperature control plan based on other factors such as predicted demands of battery, charging cost, user requests/reservations, environmental conditions, future or current events (e.g., a battery exchange, power outage, etc.), etc.

Various embodiments of the present technology may provide one or more of the following technological improvements: (1) efficient real-time or near real-time creations of customized battery temperature control plans ready for a battery-exchange station to follow; (2) the ability to effectively increase/maximize battery life spans and performance; (3) the ability to enable an operator to set up desirable battery temperature control plans based on multiple factors; and (4) the ability to provide enhanced user experiences by offering satisfying battery experience in an energy-efficient fashion.

In the following description, for the purposes of explanation, numerous specific details are set forth in order to provide a thorough understanding of embodiments of the present technology. It will be apparent, however, that embodiments of the present technology may be practiced without some of these specific details.

FIG. 1A is a schematic diagram illustrating a system 100 in accordance with embodiments of the disclosed technology. The system 100 is configured to collect characteristic information from multiple sampling batteries 101 (shown as 101A-C in FIG. 1A). The system 100 includes a server 103, a database 105 coupled to the server 103, and a battery-exchange station 107. As shown, the battery-exchange station 107 can communicate with the server 103 via a network 109. Each of the sampling batteries 101 includes a battery memory 113 (shown as 113A-C in FIG. 1A). The battery memory 113 is configured to store and record characteristic information associated with the corresponding sampling battery 101. In some embodiments, the battery memory 113 can be coupled to a controller (e.g., a control chip, a processor, a circuit, etc., not shown in FIG. 1A) attached to the sampling battery 101. The controller can manage the characteristic information stored in the battery memory 113. In some embodiments, the characteristic information can be periodically updated such as each time it is charged. In some embodiments, the characteristic information can include minimum/maximum temperature recorded, discharge rates, etc.

As shown in FIG. 1A, in one embodiment, the server 103 is configured to collect characteristic information from the battery memory 113A through the battery-exchange station 107 via the network 109. In some embodiments, the server 103 can receive characteristic information from the battery memory 113B via the network 109. The server 103 can also receive characteristic information from the battery memory 113C through a mobile device 111 (e.g., a battery user's smartphone that has an app configured to read information from the memory of the sampling battery 101C via a short range protocol such as Bluetooth etc.) and forward the information to the server 103 via the network 109. After collecting the characteristic information, the server 103 can analyze the collected characteristic information to determine or identify battery characteristics or patterns that can be used as reference information to generate customized battery management plans for the battery 101 or similar batteries. Embodiments of the server 103 are discussed in detail below with reference to FIG. 4.

The database 105 can store information associated with the present disclosure (e.g., information collected by the server 103 such as characteristic information of the sampling batteries 101, information analyzed by the server 103, information generated by the server 103, reference information, user account information, user battery plans, user histories, user behavior, user driving/riding habits, environmental conditions, event information, etc.). In some embodiments, the database 105 also stores information from a publicly accessible database (e.g., weather forecast database, travel alert database, traffic information database, location service database, map database, etc.) maintained by government or private entities. In some embodiments, the database 105 can also store proprietary information (e.g., user account information such as login/password, etc., user credit history, user subscription information, etc.).

The network 109 can be a local area network (LAN) or a wide area network (WAN), but it can also be other wired or wireless networks. The network 109 can be the Internet or some other public or private network. The battery-exchange station 107 or the mobile device 111 can be connected to the network 109 through a network interface (e.g., by a wired or wireless communication). The server 103 can be coupled to the database 105 via any kind of local, wide area, wired, or wireless network, including the network 109 or a separate public or private network. In some embodiments, the network 109 includes a secured network that is used by a private entity (e.g., a company, etc.).

In some embodiments, the battery-exchange station 107 can be configured to collect characteristic information from the sampling batteries 101 and perform the analysis discussed above. In such embodiments, the battery-exchange station 107 can analyze the collected characteristic information to determine or identify battery characteristics or patterns that can be used as reference information for generating customized battery management plans. Such reference information can be stored locally (e.g., in the battery-exchange station 107) or can be transmitted or uploaded to the server 103. Embodiments of the battery-exchange station 107 are discussed in detail below with reference to FIGS. 2A and 3.

Figure 1B:
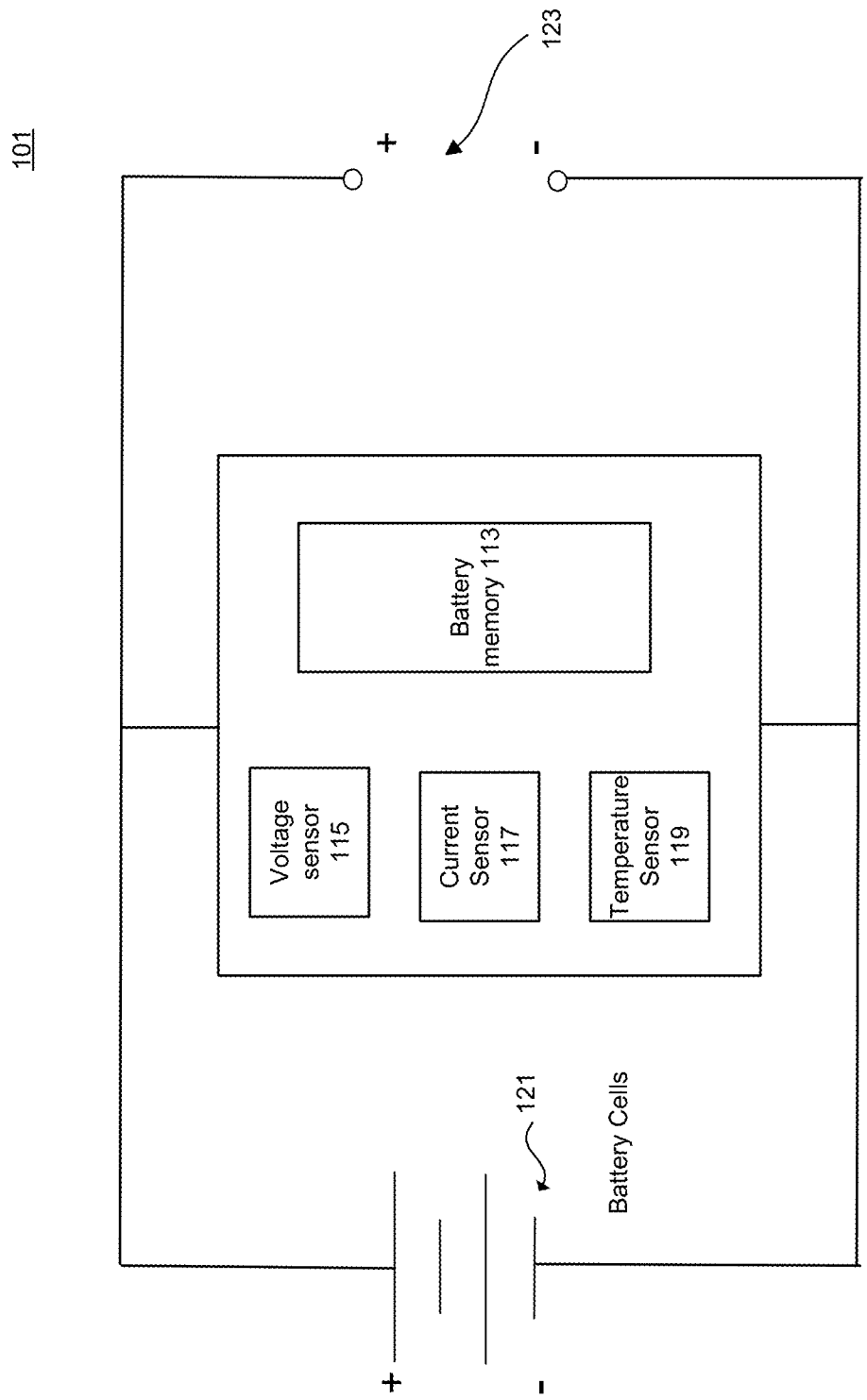
FIG. 1B is a schematic diagram illustrating an energy storage device (e.g., a battery) in accordance with an embodiment of the disclosed technology.

FIG. 1B is a schematic diagram illustrating the battery 101 in accordance with embodiments of the disclosed technology. As shown, the battery 101 includes a battery memory 113, a voltage sensor 115, a current sensor 117, a temperature sensor 119, one or more battery cells 121, and connectors 123 configured to couple to an external device (e.g., a load such as an electric motor). The battery cells 121 stores electric energy therein. The voltage sensor 115 is configured to measure a charging voltage of the battery 101. The current sensor 117 is configured to measure a charging or discharging current of the battery 101 (e.g., at the connectors 123). The temperature sensor 119 is configured to measure a charging or discharging temperature or a temperature during idle (e.g., a battery cell temperature and/or a battery circuit temperature) of the battery 101. The measured information is stored in the battery memory 113 and can be accessible via a wired or wireless connection by a mobile device, a battery-exchange station, a vehicle, and/or a server.

Figure 2A:
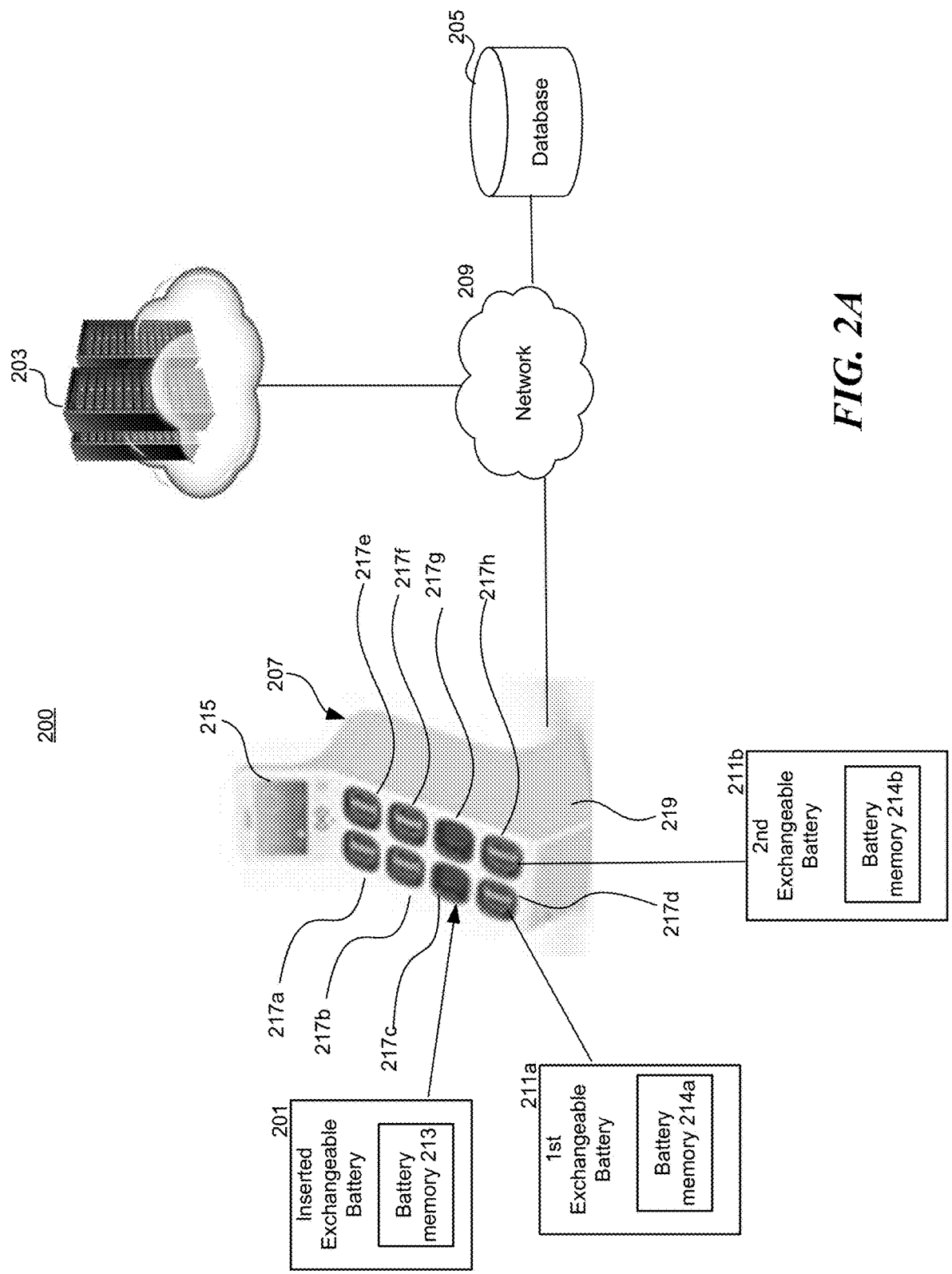
FIG. 2A is a schematic diagram illustrating a system in accordance with an embodiment of the disclosed technology. The system is configured to determine a battery management plan for two or more exchangeable batteries to be charged.

FIG. 2A is a schematic diagram illustrating a system 200 in accordance with embodiments of the disclosed technology. The system 200 is configured to provide two batteries in a battery-exchange station 207. In some embodiments, the battery-exchange station 207 can determine which batteries are to be provided to a user by analyzing an inserted exchangeable battery 201 (in some embodiments, there can be two inserted batteries 201). In some embodiments, the battery-exchange station 207 can determine the batteries to be provided based on a user profile associated with the user (e.g., from a server, a user input, or a user's mobile device). Based on the determined types, the battery-exchange station 207 can then identify first and second exchangeable batteries (e.g., batteries 211a, 211b are picked for the same or similar characteristic).

In some embodiments, the battery-exchange station 207 initially identifies the first exchangeable battery 211a based on a user profile associated with the user (e.g., to select a battery with the highest SoC since the user profile indicates that the user has subscribes a high-performance battery plan). Then the battery-exchange station 207 identifies the second exchangeable battery 211b by finding the "closest" or "most similar" one among the rest of the batteries based on the characteristics of the available batteries. That way, the battery-exchange station 207 can identify two similar batteries to be provided to the user. In some embodiments, the battery-exchange station 207 can identify the first and second exchangeable batteries (e.g., batteries 211a, 211b) at the same time by selecting two similar batteries among the available batteries based on the characteristics of all the available batteries (positioned in the station 207).

The system 200 includes a server 203, a database 205, and the battery-exchange station 207. The server 203, database 205, and the battery-exchange station 207 can communicate with one another via a network 209. As shown, the battery-exchange station 207 includes (i) a display 215 configured to interact with a user, and (ii) a battery rack 219 having eight battery slots 217a-h configured to accommodate batteries to be charged.

During operation, there are only six battery slots (e.g., slots 217a, 217b, 217d, 217e, 217f, and 217h) occupied by batteries, and the remaining two slots (e.g., slots 217c and 217g) are reserved for a user to insert a battery to be exchanged (e.g., low power or depleted batteries). In some embodiments, the battery-exchange station 207 can have different arrangements such as different numbers of racks, displays, and/or slots. In some embodiments, the battery-exchange station 207 can include modular components (e.g., modular racks, modular displays, etc.) that enable an operator to conveniently install or expand the capacity of the battery-exchange station 207. The battery-exchange station 207 can be electrically coupled to one or more power sources (e.g., power grid, power lines, power storage systems, solar cells, wind-powered generators, etc.) to receive power to charge the batteries positioned therein and to perform other operations (e.g., to communicate with the server 203). In some embodiments, a user can remove a battery from the battery-exchange station 207, without inserting one beforehand. In some embodiments, the battery-exchange station 207 can have a locking mechanism for securing the batteries positioned therein. In some embodiments, the battery-exchange station 207 can be implemented without the locking mechanism.

Embodiments below discuss how the characteristics of batteries can be analyzed and accordingly how reference information can be generated. As discussed above with reference to FIG. 1, a set of reference information is generated based on characteristic information collected from the multiple sampling batteries 101. In some embodiments, the reference information is stored in the database 205 or the server 203. A user inserts the battery 201 (which includes a battery memory 213 configured to store various types of characteristic information discussed above) into an empty battery slot (e.g., slot 217*c*, as shown in FIG. 2A) of the battery-exchange station 207. The battery-exchange station 207 can collect the characteristic information (and transmit the same to the server 203, in some embodiments). In some embodiments, the station 207 analyzes the collected characteristic information and identifies the characteristics of the inserted battery 201. In some embodiments, the server 203 analyzes the collected battery information and identifies the characteristics of the inserted battery 201. The station 207 (or the server 203) compares the identified characteristics with the stored reference information. Based on the comparison, the station 207 can identify the first and second exchangeable batteries 211*a*, 211*b* based on battery similarities as discussed above. For example, the system 200 can identify the first and second batteries 211*a*, 211*b* based on one or more battery characteristics such as battery manufacture, hardware/firmware versions, SoC, a difference of SoC, FCC, usage, expected/actual charging temperatures, etc.

The system 200 then generates a suitable battery management plan for the inserted battery 201. The battery management plan includes charging the inserted battery 201 in particular ways (e.g., following a charging pattern such as one shown in FIGS. 5A-5C) during a preparation time period. The system 200 accordingly selects/prepares/conditions the inserted battery 201 for a user to exchange.

In some embodiments, the system 200 can identify one or more characteristics of the inserted battery 201 and then identify another battery in the station 207 by finding a match (or a general match) from the reference information. For example, the system 200 first identifies that the first battery 201 is a "type A" battery and then identifies another battery by selecting another "type A" battery in the station 207 (or nearby the station 207).

The system 200 then implements the battery management plan for the inserted battery 201 during the preparation time. When a user picks up the inserted battery 201 and the matched battery, the system 200 ensures that the user receives a pair of batteries with similar characteristics. This enhances overall user experience and improves battery performance.

In some embodiments, the server 203 analyzes the collected characteristic information and identifies the characteristics of the inserted battery. Then the system compares the identified characteristics with the stored reference information. Based on the comparison, the server 203 can select suitable temperature requirements when charging from the stored reference information. The sever 203 accordingly generates a customized battery temperature control plan for the inserted battery 201 to achieve an objective (e.g., longest life span, high performance, etc.). In some embodiments, the customized battery temperature control plan may work together with a customized/selected battery charging plan that the server 203 assigns to the inserted battery 201 (or the battery-exchange station 207). In some embodiments, the customized battery temperature control plan can be treated as part of the customized/selected battery charging plan.

In some embodiments, the server 203 can identify one or more characteristics of the exchangeable battery 201 and then generate the customized battery temperature control plan by finding a match (or a general match) from the reference information. In some embodiments, the server 103 can first identify a previous battery temperature control plan for the inserted battery 201 (e.g., from the collected information) and then adjust it based on the reference information so as to generate the customized battery temperature control plan for the exchangeable battery 201. For example, a recent analysis/study (which can be part of the reference information) suggests that the exchangeable battery 201 can perform better if it is charged at (or below) a specific temperature for a period of time. The server 203 can accordingly adjust the previous battery temperature control plan to generate an updated battery temperature control plan.

In some embodiments, the reference information can be stored in the battery-exchange station 207. In such embodiments, the battery-exchange station 207 analyzes/compares the collected information and the reference information to generate the customized battery temperature control plan. The battery-exchange station 207 can also locally store/manage a set of generated customized battery temperature control plans for future use. In some embodiments, the battery-exchange station 207 can upload the generated customized battery temperature control plans to the server 203 for future use.

As shown in FIG. 2A, a user can pick up the first battery 211*a* (having a battery memory 214*a*) and the second battery 211*b* (having a battery memory 214*b*) at the station 207. The first and second batteries 211*a*, 211*b* have been charged by the battery-exchange station 207 based on a battery temperature control plan customized for the first and second batteries 211*a*, 211*b* (e.g., this battery temperature control plan was generated/recalled/updated when the first and second batteries 211*a*, 211*b* were inserted into the battery slots 217*d*, 217*h*). Based on a scheduled pick-up time for a battery (or a battery demand prediction) and the temperature control plan, the system 200 can ensure the temperatures of the first and second batteries 211*a*, 211*b* are within an acceptable temperature range when the user picks it up. This enhances overall user experience and improves battery performance.

Figure 2B:
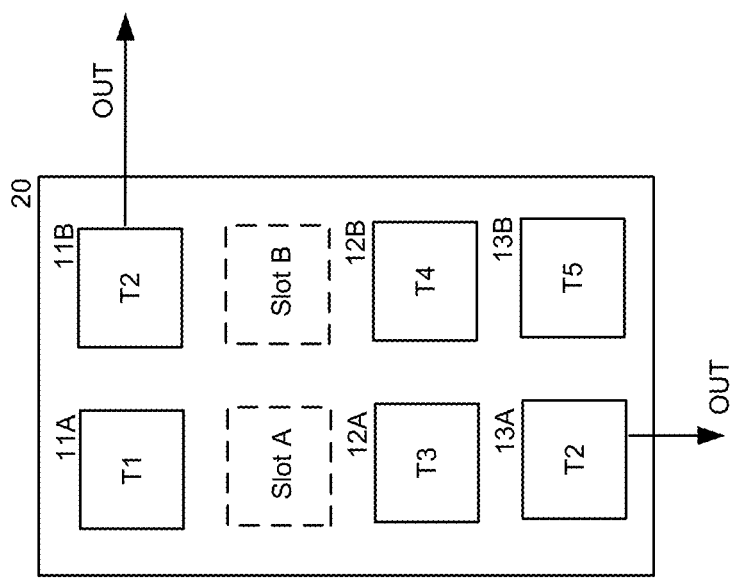
FIG. 2B is a schematic diagram illustrating a battery-exchange station system in accordance with an embodiment of the disclosed technology.

FIG. 2B is a schematic diagram illustrating a battery-exchange station 20 in accordance with embodiments of the disclosed technology. As shown, the system 20 has six batteries 11A-B, 12A-B, and 13A-B and two battery slots A, B. As shown, the battery 11A is a "T1" type battery. The batteries 11B, 13A are "T2" type batteries. The battery 12A is a "T3" type battery, the battery 12B is a "T4" type battery, and the battery 13B is a "T5" type battery. In the illustrated embodiment, the system 20 can pair the "T2" type batteries 11B and 13A and generate a battery management for these batteries. The paired batteries 11B, 13A can be provided to the next user who comes to the system 20 for battery-exchange. If the SoC of the paired batteries 11B, 13A are not matched, then the system (or the battery-exchange station 20) can deploy two corresponding charging plans for these two batteries, respectively, so that the SoC of these batteries can be matched later when they are provided to a user. In another embodiment, the SoC information is set as a primary or critical factor to the similarity match, if batteries 11B, 13A are matched in all aspect but only the SoC of these two batteries are not matched, the system (or the battery-exchange station 20) can decide not to select these two batteries and turn to find other batteries that can be matched with either one of the batteries 11B or 13A.

Figure 2C:
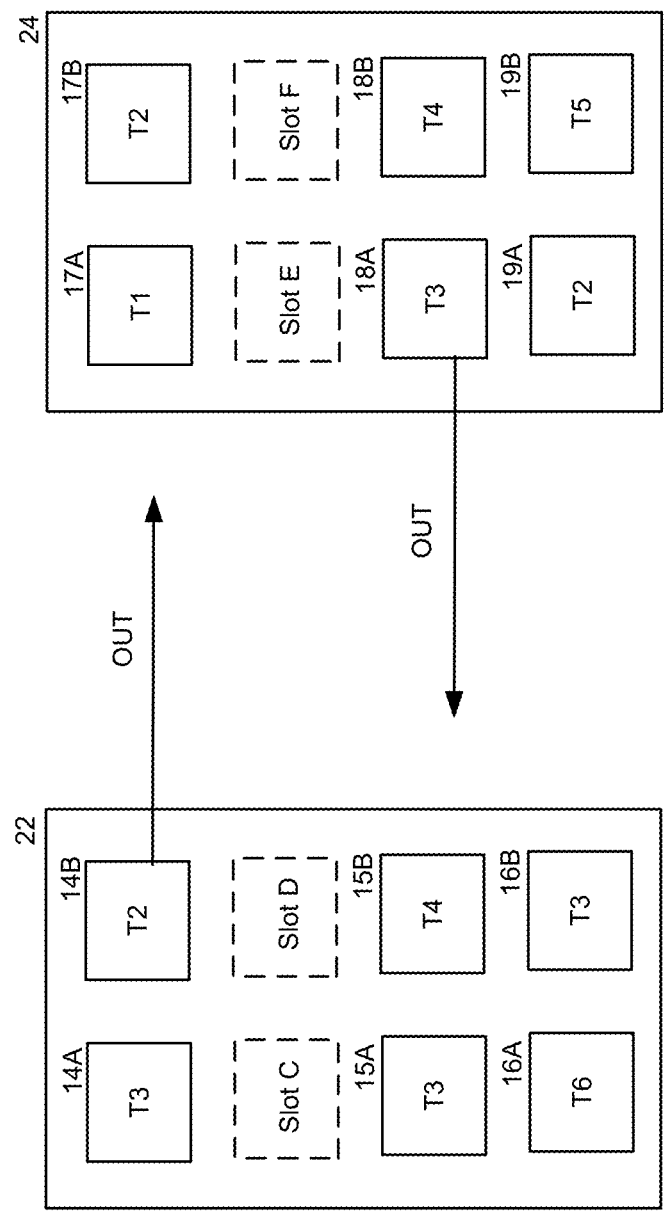
FIG. 2C is a schematic diagram illustrating two battery-exchange station systems in accordance with an embodiment of the disclosed technology.

FIG. 2C is a schematic diagram illustrating two battery-exchange systems 22 and 24 in accordance with embodiments of the disclosed technology. Embodiments disclosed in FIG. 2C are indicative of a portion of a battery location optimization process, which is designed to adjust the locations of the batteries in systems 22, 24 such that batteries with same or similar characteristics are located close to one another. As shown, the system 22 includes six batteries 14A-B, 15A-B, and 16A-B and two slots C, D. The system 24 includes six batteries 17A-B, 18A-B, and 19A-B and two slots E, F. As shown, the battery 17A is a "T1" type battery, the batteries 14B, 17B, 19A are "T2" type batteries, the batteries 14A, 15A, 16B, 18A are "T3" type batteries, the batteries 15B, 18B are "T4" type batteries, the battery 19B is a "T5" type battery, and the battery 16A is a "T6" type battery.

In the illustrated embodiments, when the systems 22, 24 perform the battery location optimization process, the battery 14B will be moved from the system 22 to the system 24, and the battery 18A will be moved from the system 24 to the system 22. After the process, the system 22 will have two pairs of "T3" type batteries, and the system 24 will have three "T2" type batteries. In some embodiments, a system operator can instruct a service crew to move the batteries 14B and 18A. In some embodiments, the batteries 14B and 18A can be delivered by one or two motivated users (e.g., the system operator can use financial incentives, advertisements, activities, games, social events, etc. to motivate the user(s) to do so). For example, the system operator can send a notice to all battery users near the station 22, asking them to deliver the battery 14B to the system 24 (and bring the battery 18A back to the system 22) to get a 10% discount for the next month's battery-exchanges. In other embodiments, the users can be motivated by other suitable methods.

FIG. 3 is a schematic diagram illustrating a station system 300 in accordance with embodiments of the disclosed technology. The station system 300 described herein can be the system operating in the station 107 shown in FIG. 1A or the station 207 shown in FIG. 2A. As shown, the station system 300 includes a processor 301, a memory 303, a user interface 305, a communication component 307, a battery management component 309, one or more sensors 311, a storage component 313, and a charging component 315 coupled to multiple battery slots 317a-n. The processor 301 is configured to interact with the memory 303 and other components (e.g., components 305-317) in the station system 300. The memory 303 is coupled to the processor 301 and is configured to store instructions for controlling other components or other information in the station system 300.

The user interface 305 is configured to interact with a user (e.g., receiving a user input and presenting information to the user). In some embodiments, the user interface 305 can be implemented as a touchscreen display. In other embodiments, the user interface 305 can include other suitable user interface devices. The storage component 313 is configured to store, temporarily or permanently, information, data, files, or signals associated with the station system 300 (e.g., information measured by the sensors 313, information collected by the batteries 317a-n, reference information, charging instructions, user information, etc.).

The communication component 307 is configured to communicate with other systems, such as a vehicle 31 (e.g., an electric vehicle that uses the exchangeable battery 201 as its power source), a mobile device 32 (e.g., a battery user's smartphone that has an app configured to manage the exchangeable battery 201), a server 33 (e.g., the server 103, 203 or the server system 400 to be discussed below with reference to FIG. 4), other station systems, and/or other devices.

The battery management component 309 is configured to collect characteristic information from various sources and to analyze the collected information. For example, the battery management component 309 can collect information regarding the batteries positioned in the battery slots 317a-n, information regarding the station system 300, information regarding one or more power sources 34, information regarding a user (e.g., received from the mobile device 32 via the communication component 307), and/or information regarding the vehicle 31. In some embodiments, the battery management component 309 can provide all or some of the information to the communication component 307 to transmit or upload the collected information to the server 33 for further analysis or process. After receiving the characteristic information, the server 33 can analyze the received characteristic information and compare it to the reference information to generate a customized battery management plan for batteries to achieve predetermined objectives.

In some embodiments, the battery management component 309 can manage the batteries positioned in the battery slots 317 based on instructions from the server 33 (which can function in the ways similar to the server 103, 303 and the server system 400 to be discussed in detail below with reference to FIG. 4). In some embodiments, the battery management component 309 can periodically communicate with the server 33 to request updated instructions.

In some embodiments, the battery management component 309 can analyze the collected characteristic information associated with a battery inserted in one of the battery slots 317 and compare the collected characteristic information with the reference information. The battery management component 309 is also configured to identify another battery that has similar or the same battery characteristics as the inserted battery (e.g., based on the battery characteristics and/or battery types shown in FIGS. 5A-5C). The battery management component 309 then pairs these two batteries and generates a customized battery management plan for these two batteries. In some embodiments, the battery management component 309 can identify similar batteries from all the batteries in the system periodically, responsive to a triggering event (e.g., a battery swapping by a user, a battery transfer, etc.).

In some embodiments, the battery management component 309 can analyze the collected characteristic information associated with a battery inserted in one of the battery slots 317 and compare the collected characteristic information with the reference information. The battery management component 309 can accordingly generate a customized battery temperature control plan for the inserted battery based on the comparison.

The charging component 315 is configured to control a charging process for each of the batteries positioned in the battery slots 317a-n (e.g., based on individual customized battery management plans generated by the server 33 or the battery management component 309). The battery slots 317a-n are configured to accommodate and charge the batteries positioned and/or locked therein. The charging component 315 receives power from the power sources 34 and then uses the power to charge the batteries positioned in the battery slots 317a-n, based on predetermined customized battery management plans or battery temperature control plans.

In some embodiments, the customized battery management plans can be adjusted based on a battery demand prediction generated by the server 33 (e.g., the battery demand prediction can be generated based on predicted user behavior, station characteristics, events close to a battery-exchange station, etc.). For example, the station system 300 can decide to change a battery management plan in response to a determination that there will not be sufficient power available from the power sources 34 to charge the battery during a period of time.

In some embodiments, the customized battery temperature control plans can be adjusted based on a battery demand prediction generated by the server 33 (e.g., the battery demand prediction can be generated based on predicted user behavior, station characteristics, events close to a battery-exchange station, etc.). For example, the station system 300 can decide to change a battery temperature control plan in response to a determination that there will not be sufficient power available from the power sources 34 to charge the battery during a period of time.

The sensors 311 are configured to measure information associated with the station system 300 (e.g., working temperature, environmental conditions, power connection, network connection, etc.). The sensors 311 can also be configured to monitor the batteries positioned in the battery slots 317*a*-*n*. The measured information can be sent to the battery management component 309 and/or the server 33 for further analysis. In some embodiments, the measured information can be included in the reference information that is used to generate the customized battery management plans. For example, the customized battery management plans can vary depending on the temperature surrounding the station system 300 or the temperatures at the battery slots 317.

Figure 4:
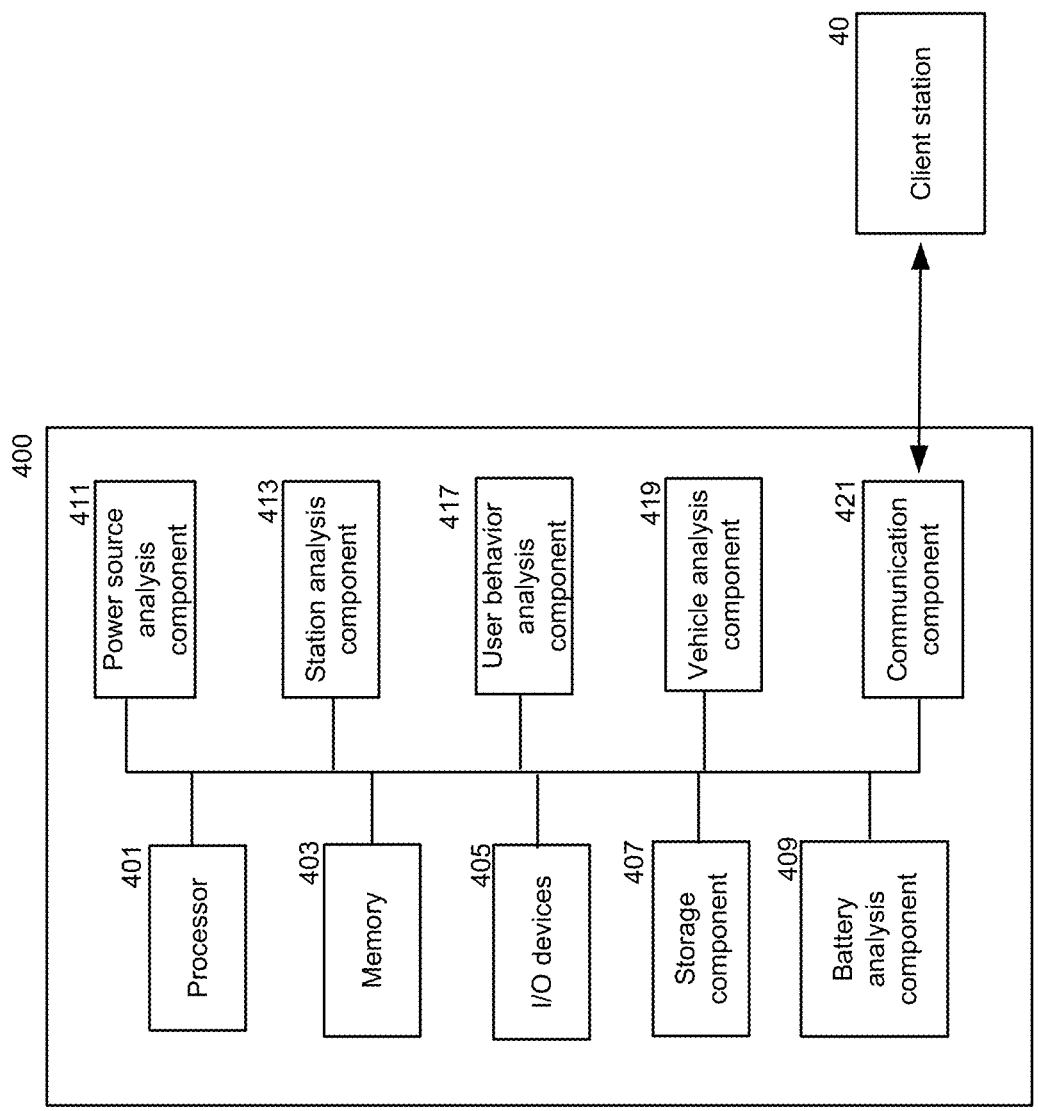
FIG. 4 is a schematic diagram illustrating a server system in accordance with an embodiment of the disclosed technology.

FIG. 4 is a schematic diagram illustrating a server system 400 in accordance with embodiments of the disclosed technology. The server system 400 is also configured to collect information associated with multiple batteries that can be deployed or managed by the server system 400 (e.g., through instructions to the connected stations such as a client station 40). The server system 400 is also configured to analyze the collected information and generate, based on the analysis, a customized battery management plan for the client station 40 to control a charging process therein. In some embodiments, the client station 40 can be implemented as the battery-exchange station 107 or 207 discussed above. In other embodiments, the client station 40 can be implemented as other suitable client devices.

As shown in FIG. 4, the server system 400 includes a processor 401, a memory 403, input/output (I/O) devices 405, a storage component 407, a battery analysis component 409, a power source analysis component 411, a station analysis component 413, a user behavior analysis component 417, a vehicle analysis component 419, and a communication component 421. The processor 401 is configured to interact with the memory 403 and other components (e.g., components 405-421) in the server system 400.

The I/O devices 405 are configured to communicate with an operator (e.g., receive an input therefrom and/or present information thereto). In some embodiments, the I/O devices 405 can be one component (e.g., a touch screen display). In some embodiments, the I/O devices 405 can include an input device (e.g., keyboards, pointing devices, card reader, scanner, camera, etc.) and an output device (e.g., a display, network card, speaker, video card, audio card, printer, or other external device).

The storage component 407 is configured to store, temporarily or permanently, information, data, files, or signals associated with the server system 400 (e.g., collected information, reference information, information to be analyzed, analysis results, etc.). In some embodiments, the storage component 407 can be a hard disk drive, flash memory, or other suitable storage means. The communication component 421 is configured to communicate with other systems (e.g., the client station 40 or other stations) and other devices (e.g., a mobile device carried by a user, a vehicle, etc.).

The battery analysis component 409 is configured to collect and store (e.g., in the storage component 407) characteristic information (including battery temperature information) to be analyzed. The collected information can be collected from multiple sampling batteries from various sources (e.g., battery-exchange stations, electric vehicles, batteries, user mobile devices, etc.). After receiving the collected information, the battery analysis component 409 can analyze the collected information.

In some embodiments, the battery analysis component 409 can categorize the collected characteristic information based on multiple factors such as (1) battery manufacturer, (2) battery basic characteristics, and (3) battery usage. Through analyzing the collected characteristic information versus the multiple factors mentioned above, the battery analysis component 409 establishes a set of reference information that enables the system operator to understand how to control the battery (e.g., its temperature) of a particular type of rechargeable battery during different stages (e.g., charging, discharging, idling, etc.) to achieve an objective or goal. The established reference information can be used to generate a battery management plan for batteries in the client station 40.

In some embodiments, the battery analysis component 409 prioritizes the collected information based on their relative importance or reliability. For example, the battery analysis component 409 can use the "battery manufacturer" as a primary factor and set other items as secondary factors when determining a customized battery management plan for the client station 40 (e.g., for each battery positioned therein). In such embodiments, the system 400 can first create a charging curve (e.g., as shown in FIGS. 5A-5C, to be discussed in detail below) for the client station 40 based on the manufacturer of the battery to be charged. The battery analysis component 409 can then consider other secondary factors to adjust the identified charging curve.

In some embodiments, the battery analysis component 409 determines which types of collected information to be included in the battery demand prediction based on empirical studies, results of a machine learning process, and/or system operator's preference.

In some embodiments, the battery analysis component 409 determines the priorities or weightings for each type of the collected information based on the reliability of the collected information. For example, the analysis can give it higher weighting or priority to information measured and collected from memories coupled to the batteries, because the server system 400 considers such information is direct/internal and thus more reliable than indirect/external information such as environmental conditions (e.g., a weather forecast, an event notice, etc.).

In some embodiments, the battery analysis component 409 communicates and works together with other components in the system 400 (e.g., components 411-419) to generate a customized battery management plan (e.g., a customized battery temperature control plan) for the client station 40 (e.g., for each battery positioned therein). In some embodiments, however, the system 400 can operate without components 411-419.

The power source analysis component 411 is configured to analyze the status (e.g., reliability, stability, continuity, etc.) of one or more power sources that are used to power the client station 40 for charging the batteries therein. For example, the power source analysis component 411 can determine that a power source used to supply power to the client station 40 will be interrupted during 1 a.m. to 3 a.m. on a particular date, and then the power source analysis component 411 can accordingly adjust a battery management plan (e.g., delay it or shift it to an earlier time). In some embodiments, the power source analysis component 411 can also consider the cost for charging in different time periods. For example, the power source analysis component 411 can determine that the charging cost from a power source is reduced during off-peak hours. The power source analysis component 411 can determine whether it is feasible for the client station 40 to charge its batteries during the off-peak hours. If so, the power source analysis component 411 can adjust the battery management plan to reduce charging costs.

The station analysis component 413 is configured to categorize the multiple battery stations into various types and identify representative characteristics/patterns for each type, such that the battery analysis component 409 can use such information as a basis for its analysis. For example, the station analysis component 413 analyzes the collected information and divides the multiple battery stations into various types based on their battery demands. Based on these types, the battery analysis component 409 and the station analysis component 413 can quickly determine a suitable battery management plan, especially in cases where the collected information is insufficient for the battery analysis component 409 to perform a normal analysis.

Similar to the station analysis component 413, the user behavior analysis component 417, and the vehicle analysis component 419 are also configured to categorize the user behavior and vehicles powered by the batteries, respectively, into various types and identify representative characteristics/patterns for each type. The user behavior analysis component 417 can categorize the user behavior based on how they exchange and/or use the batteries. For example, a user can be very demanding on battery performance (e.g., a professional racer). As another example, another user may only use battery to power its vehicle for daily errands (e.g., picking up children or grocery shopping). Once a user reserves a battery at the client station 40, the client station 40 then provides information associated with the reservation to the server system 400. The server system 400 can then determine the type/category of the user who made the reservation and accordingly adjust the battery management plan for the client station 40 (e.g., the server system can learn that the user is a professional racer and instruct the client station 40 to charge/prepare batteries accordingly). In some embodiments, such adjustment can be made by the client station 40.

The vehicle analysis component 419 can categorize the types of vehicles that users are planning to operate. For each type of vehicles, the vehicle analysis component 419 can determine which types of batteries work best for each type of vehicles. For example, the vehicle analysis component 419 can determine that an electric scooter works best with a specific type of battery after a particular charging process. In such embodiments, the vehicle analysis component 419 can work with the battery analysis component 409 to adjust the battery management plan (and the corresponding charging instructions), if the server system 400 receives related vehicle information. In some embodiments, such information can be found in the user profiles or account information. In other embodiments, such vehicle information can be provided by the client station 40 to the server system 400.

In some embodiments, the server system 400 can generate a customized battery management plan for the client station 40 in a real-time or near real-time manner. In such embodiments, the server system 400 monitors the status of the client station 40. Once there is a change (e.g., a user just removed two fully-charged batteries and left two empty ones at the client station 40) or a potential change (e.g., a user makes a reservation to exchange batteries at the client station 40) that may affect a battery charging process of the client station 40, the server system 400 can perform the analysis mentioned above and generate an updated battery management plan for the client station 40 to follow. In some embodiments, the change or potential change can be transmitted to the server system 400 from a mobile device (e.g., a user uses an app installed thereon to make a battery reservation), another server (e.g., a web-service server associated with an app used by a user), and/or the client station 40.

In some embodiments, the server 400 can consider a combination of factors mentioned above to generate a customized battery temperature control plan. For example, based on the analysis performed by the user behavior analysis component 417 and the vehicle analysis component 419, the system 400 can determine that a "grocery-shopping" type of user who rides a "low-power consumption" scooter is planning on taking two batteries at 2 p.m. The server 400 can then select/reserve two proper batteries for the user and then generate/implement a customized battery temperature control plan for the selected/reserved batteries. Accordingly, the releasing temperature of the two selected batteries can be controlled by the system 400. In other embodiments, if the system 400 determines that a "premium-battery" type of user who rides a "high-performance" scooter is going to exchange four batteries at the same time, the system 400 will charge these four batteries based on another customized battery temperature control plan, which will result in a lower release temperature of the four batteries, compared to the release temperature of the two batteries reserved for the "grocery-shopping" type of user.

In some embodiments, the server system 400 can generate a customized battery temperature control plan for the client station 40 in a real-time or near real-time manner. In such embodiments, the server system 400 monitors the status of the client station 40. Once there is a change (e.g., a user just removed two fully-charged batteries and left two empty ones at the client station 40) or a potential change (e.g., a user makes a reservation to exchange batteries at the client station 40 or a prediction of battery demand indicates that there will be a battery demand in 1 hour) that may affect a battery charging process of the client station 40, the server system 400 can perform the analysis mentioned above and generate an updated battery temperature control plan for the client station 40 to follow. In some embodiments, the change or potential change can be transmitted to the server system 400 from a mobile device (e.g., a user uses an app installed thereon to make a battery reservation), another server (e.g., a web-service server associated with an app used by a user), and/or the client station 40.

FIGS. 5A-5C are schematic diagrams illustrating battery charging characteristics or patterns in accordance with embodiments of the disclosed technology. FIG. 5A illustrates "step-charge" battery charging profiles in accordance with embodiments of the disclosed technology. As shown in FIG. 5A, a battery charging profile 51 can be illustrated based on the relationship between the state of charge (SoC) and the charging current of a battery (or a type of battery). The battery charging profiles 51, 52, and 53 are "step-charge" profiles. When charging a battery based on this type of profile, the battery is charged by different currents in different charging stages. For example, the battery charging profile 51 refers to a charging process wherein the charging current decreases when the battery is close to its full charge capacity. The battery charging profile 52 refers to a charging process having a first portion 52A and a second portion 52B. In the first portion 52A, the charging current remains constant. In the second portion 52B, the charging voltage remains constant (and accordingly the charging current varies). In some embodiments, a charging profile can include two or more stages. For example, the battery charging profile 53 refers to a charging process having a first portion 53A, a second portion 53B, and a third portion 53C. In the first portion 53A and the second portion 53B, the charging currents remain constant. In the third portion 53C, the charging voltage remains constant (and accordingly the charging current varies).

In some embodiments, the charging profile can be illustrated or characterized by other factors such as a "C-rate." The "C-rate" can be defined as a rate at which a battery is charged (or discharged) relative to its capacity. For example, a battery can have a full capacity of 1000 mA-hour. For this battery, a charging rate of 500 mA corresponds to a C-rate of "0.5," which means, by this charging rate, the battery can increase 50% of its capacity per hour. In some embodiments, the disclosed system can use "C-rate" to characterize charging profiles.

In FIGS. 5B and 5C, six two-dimensional characteristic curves (or lines) 501A-C and 505A-C are shown. In other embodiments, however, the characteristic curves can be three-dimensional or multiple-dimensional, depending on the number of factors to be considered when generating such characteristic curves. Embodiments in FIGS. 5B and 5C use the battery charging characteristics only as an example. In other embodiments, other battery characteristics (e.g., battery discharge characteristics, etc.) can be analyzed in the ways similar to those illustrated in FIGS. 5B and 5C.

Referring to FIG. 5B, the characteristic curves 501A-C represent charging features for Battery Type 1. As shown, there are two different sets of the characteristics curves/lines for Battery Type 2 and Battery Type 3, respectively. In the illustrated embodiments, Battery Types 1, 2, and 3 can be designated as "high performance" batteries for users who requests high battery performance.

The charging features are generated (e.g., by a server such as the server system 400 or by a station such as the station system 300) based on information associated with multiple sampling batteries (e.g., the collected information mentioned above). In some embodiments, the characteristic curves (e.g., the characteristic curves 501A-C) can be compared with actual measurements so as to verify and/or enhance the accuracy of these curves (e.g., compare the characteristic curve 501A with a curve generated by actual measurement from Battery Type 1). In such embodiments, the results of the comparison can be used to further adjust the characteristic curves. In some embodiments, the present technology can use this approach to fine-tune its analysis based on various factors, weightings for the factors, algorithms, etc.

As shown in FIG. 5B, the characteristic curve 501A indicates that the battery can be charged in a "step-charge" fashion, so as to achieve a pre-determined objective (e.g., increase/maximize battery capacity, extended/longest battery life, etc.). The characteristic curve 501B indicates that the charging temperature of the battery to be charged should be decreased when the charging time increases to achieve the pre-determined objective. The characteristic curve 501C indicates that the charging temperature of a battery slot (in which the battery to be charged is positioned) should be decreased when the charging time increases to achieve the pre-determined objective. Without wishing to be bonded by theory, decreasing the temperature of the battery slot during a charging process can accordingly reduce the temperature of the battery. In some embodiments, the temperature of the battery slot can be reduced by a cooling system such as a ventilation system, a heat exchanger, a cooling fluid pipe, etc.

Turning to FIG. 5C, the characteristic curves 505A-C represent charging features for Battery Type 4. As shown, there are two different sets of the characteristics curves/lines for Battery Type 5 and Battery Type 6, respectively. In the illustrated embodiments, Battery Types 4, 5, and 6 can be designated as "regular performance" batteries for users who do not request particular battery performance.

The charging features are generated (e.g., by a server such as the server system 400 or by a station such as the station system 300) based on information associated with multiple sampling batteries (e.g., the collected information mentioned above). In some embodiments, these characteristic curves can be compared with actual measurements so as to verify and/or enhance the accuracy of these curves (e.g., compare the characteristic curve 505A with a curve generated by actual measurement from Battery Type 4). In such embodiments, the results of the comparison can be used to further adjust the characteristic curves 505A-C. In some embodiments, the present technology can use this approach to fine-tune its analysis based on various factors, weightings for the factors, algorithms, etc.

As shown in FIG. 5C, for example, the characteristic curve 505A indicates that when the charging time increases, the SoC increases proportionally to achieve a pre-set goal (e.g., long life span). The characteristic curve 505B indicates that when the charging time increases, the battery charging temperature should decrease in a "step-wise" fashion so as to achieve the pre-set goal. The characteristic curve 505C indicates the temperature of the battery slot should be kept as constant during the charging process to achieve the pre-set goal. The characteristic curves/lines 501A-C and 505A-C are used to form a battery management plan for preparing two or more batteries with similar characteristics (e.g., the first and second batteries discussed above).

FIG. 5D is a schematic table illustrating battery charging characteristics or patterns in accordance with embodiments of the disclosed technology. As shown in FIG. 5D, the present system divides the sampling batteries into various types based on various battery related factors, such as manufactures, battery usage, etc. Based on the information received from an inserted battery, the present system can quickly determine suitable charging temperature characteristics (e.g., charging curves or maximum charging temperature), and accordingly generates (1) a customized battery management plan for two or more batteries managed by a system or (2) a customized temperature control plan for the inserted battery.

In some embodiments, the present technology can provide multiple types of characteristic curves or patterns that can be used as reference information to determine how to manage (e.g., charge) a particular battery to achieve an objective or a goal. In some embodiments, the objective or goal can be determined based on financial reasons (e.g., to reduce operation expenses), customer satisfaction (e.g., to provide highest possible battery experience to a user), or other suitable factors.

Figure 6:
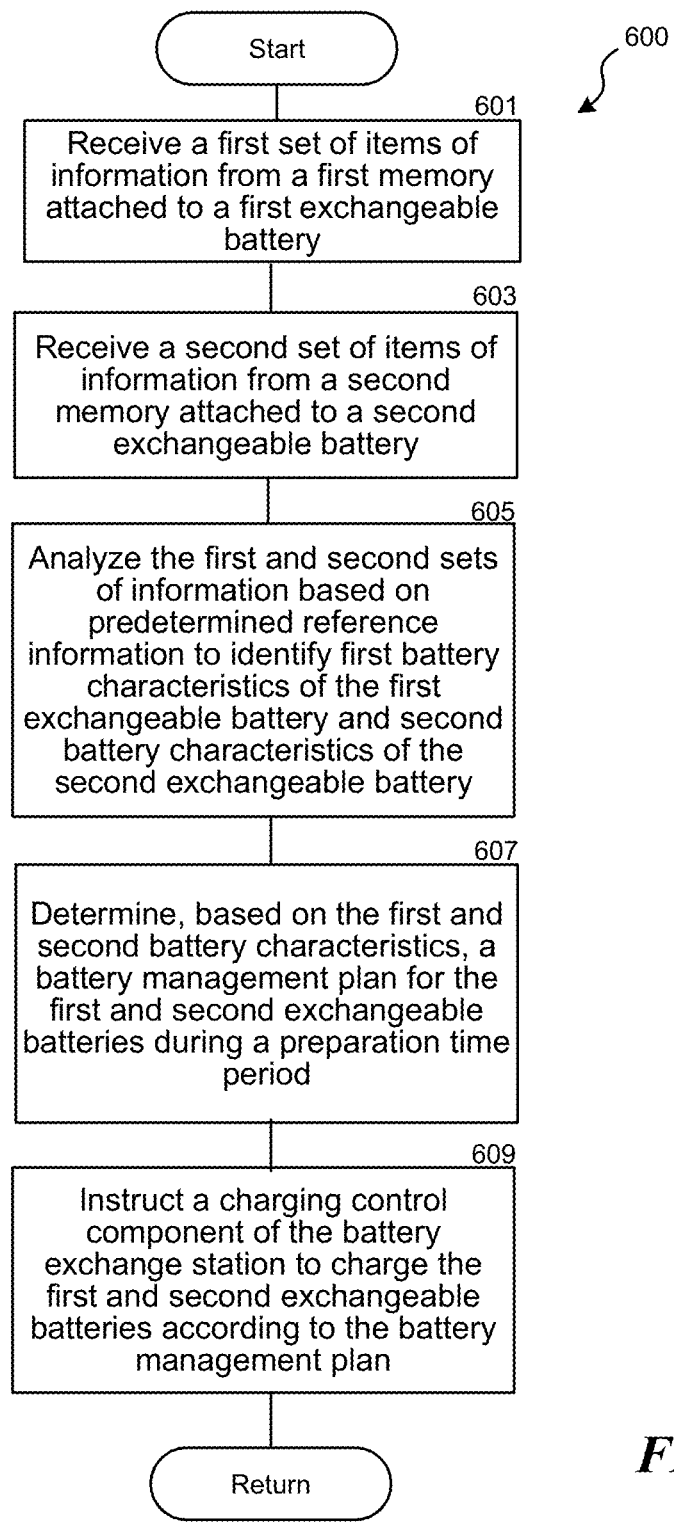
FIG. 6 is a flowchart illustrating a method in accordance with an embodiment of the disclosed technology.

FIG. 6 is a flowchart illustrating a method 600 in accordance with embodiments of the disclosed technology. The method 600 is configured to generate a battery management plan for two or more exchangeable batteries positioned in a battery-exchange station. The method 600 is also configured to implement the generated battery management plan. The method 600 can be implemented (1) by a server (e.g., the server system 400 discussed above) with a battery-exchange station (e.g., the station system 300) or (2) by a battery-exchange station alone. The method 600 starts at block 601 by receiving a first set of items of characteristic information from a first memory attached to a first exchangeable battery. The characteristic information includes battery manufacturing information, battery characteristic information, battery charging information, and battery usage information. At block 603, the method 600 continues by receiving a second set of items of information from a second memory attached to a second exchangeable battery.

At block 605, an associated system (e.g., a server or a station) analyzes the first and second sets of information based on predetermined reference information to identify first battery characteristics of the first exchangeable battery and second battery characteristics of the second exchangeable battery. In some embodiments, the predetermined reference information is generated based on information collected from multiple sampling batteries. The sampling batteries and the exchangeable battery have at least one characteristic in common (e.g., the same manufacture, the same specification, etc.), and therefore the present technology can use this characteristic in common to determine which part of the collected information (and also how much weighting should be assigned thereto) is going to be used to determine a battery management plan for the first and second exchangeable batteries.

At block 607, the method 600 then determines, based on the first and second battery characteristics, a battery management plan for the first and second exchangeable batteries during a preparation time period. At block 609, the method 600 includes instructing a charging control component of the battery-exchange station to charge the first and second exchangeable batteries according to the battery management plan. The method 600 then returns and waits for further instructions.

Figure 7:
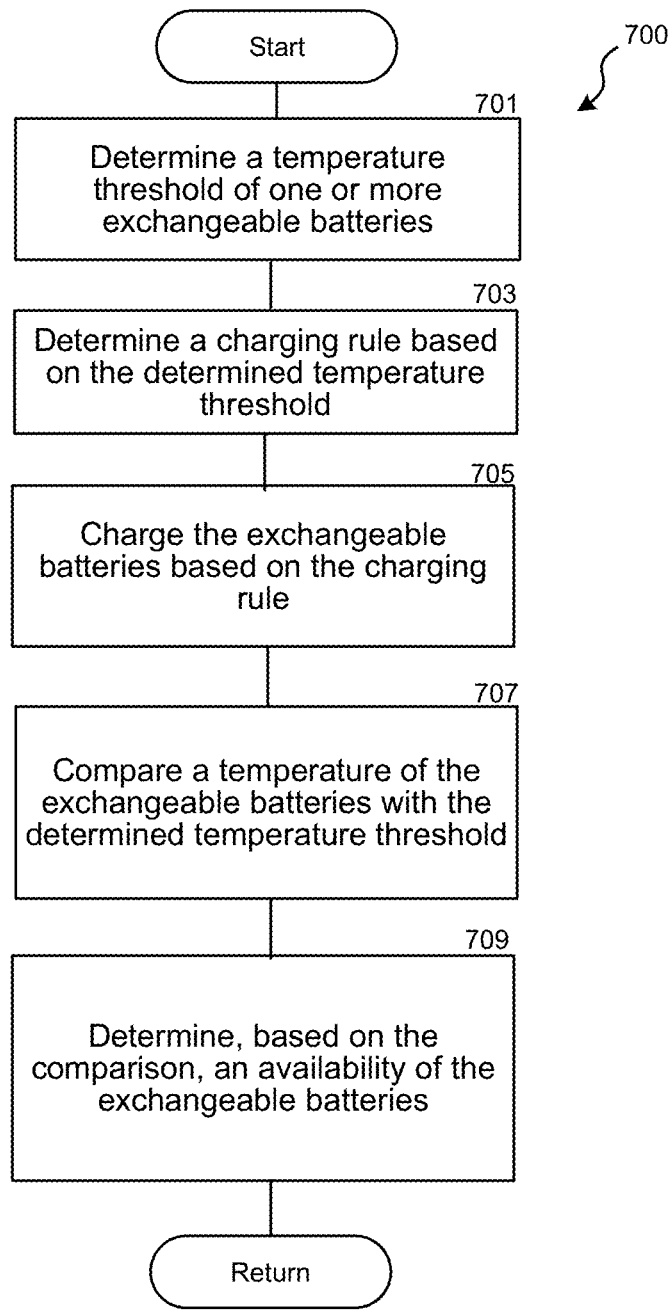
FIG. 7 is a flowchart illustrating a method in accordance with embodiments of the disclosed technology.

FIG. 7 is a flowchart illustrating a method 700 in accordance with embodiments of the disclosed technology. The method 700 is configured to manage a temperature of one or more batteries positioned in a battery-exchange station. The method 700 is also configured to charge the exchangeable battery based on a generated battery temperature control plan. The method 700 can be implemented (1) by a server (e.g., the server system 400 discussed above) with a battery-exchange station (e.g., the station system 300) or (2) by a battery-exchange station alone. The method 700 starts at block 701 by determining a temperature threshold of the one or more exchangeable batteries positioned in a battery-exchange station. The temperature threshold is determined based on one or more factors including an environmental factor, a characteristic information factor, and a user behavior factor. In some embodiments, the temperature threshold can also be determined based on a predicted battery demand.

At block 703, the method 700 continues by determining a charging rule based on the determined temperature threshold. In some embodiments, the charging rule can be determined based on characteristic information of the one or more exchangeable batteries. At block 705, the method 700 then charges the exchangeable batteries based on the charging rule. At block 707, a temperature of the exchangeable batteries is measured and is compared with the determined temperature threshold. At block 707, the method 700 determines whether the one or more exchangeable batteries can be considered "available" based on the comparison. For example, if the temperature of the one or more exchangeable batteries is accordance with the temperature threshold (e.g., within a temperature range defined by the temperature threshold), the exchangeable batteries can be considered "available" and are ready for a user to exchange.

Figure 8:
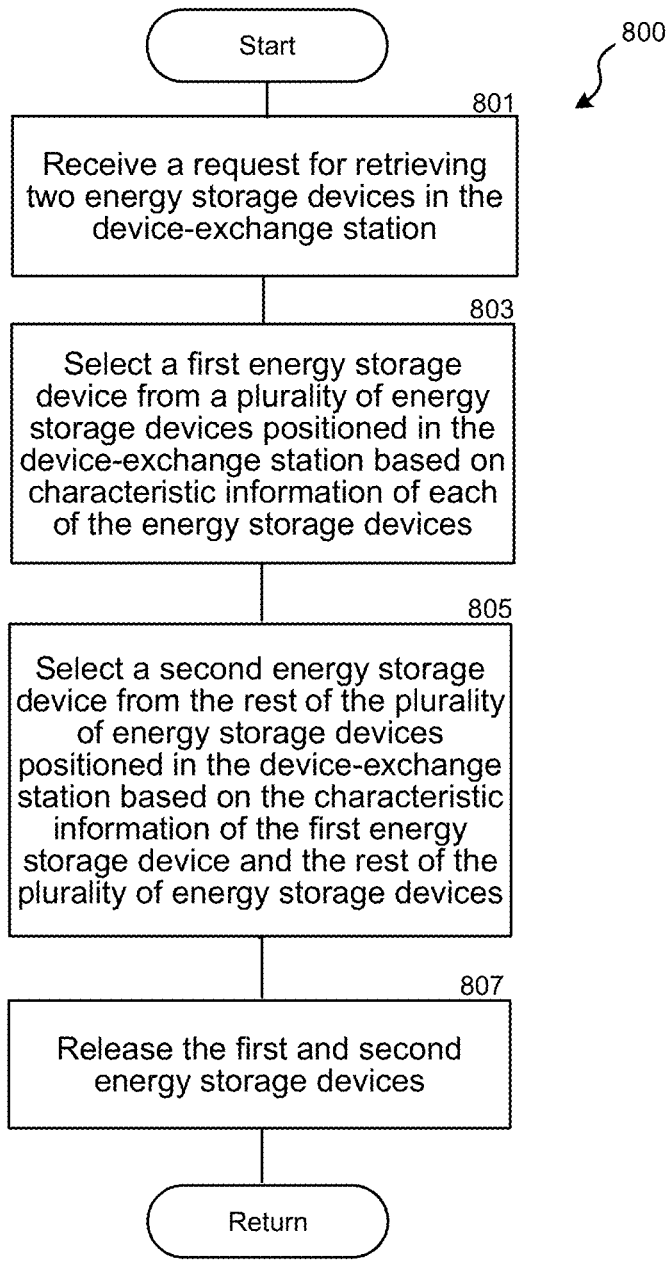
FIG. 8 is a flowchart illustrating a method in accordance with embodiments of the disclosed technology.

FIG. 8 is a flowchart illustrating a method 800 in accordance with embodiments of the disclosed technology. The method 800 is used for selecting/providing two energy storage devices positioned in a device-exchange station. In some embodiments, the method 800 can be implemented by a device-exchange station (e.g., the station system 300). The method 800 starts at block 801 by receiving a request for retrieving two energy storage devices in the device-exchange station. In some embodiments, the request can be a user input. In some embodiments, the request can be in form of a battery insertion to the device-exchange station (i.e., the user inserts a depleted battery (or batteries) in the device-exchange station to exchange a fully-charged one(s)). In some embodiments, the request can be transmitted from a user mobile device (e.g., smartphone) to the device-exchange station. In some embodiments, the request can be transmitted from a server to the device-exchange station. In some embodiments, the device-exchange station can determine which batteries to select based on a user profile associated with the request. For example, the request includes a customer identification, and the device-exchange station can communicate with a server to retrieve the user profile associated with the customer identification.

At block 803, the method 800 continues by selecting a first energy storage device from a plurality of energy storage devices positioned in the device-exchange station based on characteristic information of each of the energy storage devices. In some embodiments, the characteristic information includes SoC status of the energy storage devices and the first energy storage device can be selected based on the SoCs of the energy storage devices (e.g., select the one with the highest SoC). In some embodiments, the first energy storage device can be selected based on the user profile. For example, the user profile can indicate that the user has subscribed a plan for using new batteries (e.g., those were manufactured after a certain date). The station can then select a relative new battery as the first energy storage device. For example, the user profile can indicate that it is recommended that the user's vehicle only uses certain types of batteries, and the station can accordingly select the first energy storage device based on the user profile.

In some embodiments, the characteristic information includes a plurality of factors associated with the energy storage devices. The characteristic information can include factors regarding battery manufacturing information (e.g., battery types, battery cell types, casing shapes, manufacturer identifier, a manufacturing time, etc.), battery basic characteristics (e.g., SoCs, firmware, temperatures, a health index, etc.), and/or battery usage (e.g., charging cycles). In some embodiments, each of the plurality of factors has a weighting value. In some embodiments, the station can select the first energy storage device based on the plurality of factors and the weighting values.

At block 805, the method 800 then selects a second energy storage device from the rest of the plurality of energy storage devices positioned in the device-exchange station based on the characteristic information of the first energy storage device and the rest of the plurality of energy storage devices. The station selects the second energy storage device by matching its characteristics (factors) with those of the first energy storage device.

In some embodiments, the station can select the first and second energy storage devices based on their scores calculated based on two or more factors and corresponding weighting values. In some embodiments, the first energy storage device can have a first score (e.g., the highest score) and the second storage device can have a second score closest to the first (highest) score among scores of the rest of the plurality of energy storage devices.

In some embodiments, the factors/characteristic information can be considered in various ways. For example, the system can have several crucial characteristics/factors (such as, cell type, battery casing type, the appearance of battery casing, battery manufacturer, etc.) that are to be matched first. These crucial factors can be set as default factors by the device-exchange station or selected based on a user profile. Based on these crucial factors, the weighted scores of the batteries are calculated. Then the first battery can be selected (e.g., the one with the highest weighted score). Next, the system can then add other factors (e.g., SoCs, SoC differences, temperature differences, a distance from the first battery, etc.), along with the crucial ones, for selecting the second battery. The weighted scores for the rest of the batteries can be calculated based on all the selected factors (i.e., the crucial factors and the added factors). The second battery can then be selected based on the weighted scores (e.g., the highest one).

In some embodiments, the weighting values can vary depending on user profiles. For example, some factors such as charging cycle, cell type, and SoC can have higher weighting values for users who subscribe plans with higher fee (e.g., these users are willing to pay more for new, high-capacity, and high-SoC batteries). In some embodiments, for some "short-distance" users, since they may prefer fewer battery exchanges and do not mind having relatively old batteries, the weighting value for SoC can be higher for these users.

At block 807, the method 800 then releases the first and second energy storage devices. In some embodiments, prior to releasing the first and second energy storage devices, the method can verify whether the first and second energy storage devices meet certain threshold such as temperature, SoC, or distance threshold. In some embodiments, these thresholds can be considered when selecting the first and second energy storage devices. In some embodiments, the thresholds can be adjusted. For example, the temperature can be adjusted based on an ambient temperature of the station (e.g., if the ambient temperature is lower, then the temperature threshold can be higher). For example, for newer batteries (which can be determined based on their direct current internal resistance, DCIR), the temperature can be higher. In some cases, in order to meet a battery demand, the station can also lower the SoC threshold (e.g., from 90% to 80% such that more batteries can be provided to users (or only to some specified users)) and/or increase the temperature threshold (from 40° C. to 45° C. such that more batteries can be provided to users). In some embodiments, not only the upper bound of the temperature of the output batteries is considered (e.g. the temperature threshold set between 40° C. to 60° C.), but also the lower bound of the temperature (e.g. the temperature threshold set between 10° C. to −10° C.) can be considered.

In some embodiments, the thresholds can also be adjusted based on the user profile (e.g., based on demographic information and/or a vehicle type in the user profile information). For example, the user profile can indicate that the user is an elderly rider and prefers not to ride fast. In this example, the temperature threshold can be increased. For instance, the user profile can indicate that the user's vehicle can use batteries with a higher temperature. In this example, the temperature threshold can be increased.

In some embodiments, the various components of the system are implemented by one or more processors that are programmed to perform the functionality described. Other circuitry such as ASICS or DSPs could also be configured to implement the logic described.

In the embodiments discussed herein, a "component" can include a processor, control logic, a digital signal processor, a computing unit, and/or any other suitable device that is either configured or is programmed to execute instructions to perform the functionality described above.

Although the present technology has been described with reference to specific exemplary embodiments, it will be recognized that the present technology is not limited to the embodiments described but can be practiced with modification and alteration within the spirit and scope of the appended claims. Accordingly, the specification and drawings are to be regarded in an illustrative sense rather than a restrictive sense.

The invention claimed is:

1. A method for providing two energy storage devices positioned in a device-exchange station, the method comprising:
   receiving a request, by the device-exchange station from a mobile device of a user, for retrieving two energy storage devices in the device-exchange station;
   selecting, by the device-exchange station, a first energy storage device from a plurality of energy storage devices positioned in the device-exchange station based on characteristic information of each of the energy storage devices;
   selecting, by the device-exchange station, a second energy storage device from the rest of the plurality of energy storage devices positioned in the device-exchange station based on the characteristic information of the first energy storage device and the rest of the plurality of energy storage devices, wherein the second energy storage device is selected at least partially based on a location of the selected first energy storage device, and wherein the location is determined based on a location optimization process; and
   releasing, by the device-exchange station, the first and second energy storage devices.

2. The method of claim 1, wherein:
   the characteristic information includes a plurality of factors associated with the energy storage devices;
   each of the plurality of factors has a weighting value; and
   the method further comprises selecting the first energy storage device based on the plurality of factors and the weighting values.

3. The method of claim 2, wherein:
   the first energy storage device includes a first score determined based on the plurality of factors and the weighting values;
   the second energy storage device includes a second score determined based on the plurality of factors and the weighting values; and
   the second score is a score closest to the first score among scores of the rest of the plurality of energy storage devices.

4. The method of claim 1, wherein:
   the characteristic information includes a state of charge (SoC) of each of the energy storage devices;
   the first energy storage device has a first SoC;
   the method further comprises comparing the first SoC of the first energy storage device with SoCs of the rest of the energy storage devices; and the method further comprises selecting the second energy storage device at least partially based on the comparison, wherein the second energy storage device has a second SoC, and wherein the second SoC is an SoC closest to the first SoC among the SoCs of the rest of the plurality of energy storage devices.

5. The method of claim 4, further comprising:
determining whether the first SoC and the second SoC are higher than an SoC threshold.

6. The method of claim 1, wherein the characteristic information comprises one or more of a battery type, a cell type and a firmware version.

7. The method of claim 1, wherein the first energy storage device has a first casing shape, and wherein the second energy storage device has a second casing shape generally the same as the first casing shape.

8. The method of claim 1, wherein the characteristic information comprises temperatures of the energy storage devices, and wherein the first energy storage device has a first temperature, and wherein the second energy storage device has a second temperature, and wherein the second temperature is a temperature closest to the first temperature among the temperatures of the rest of the plurality of energy storage devices.

9. The method of claim 1, wherein selecting the second energy storage device comprises determining whether the first and the second energy storage devices have at least one factor in the characteristic information in common, and wherein the at least one factor in the characteristic information includes a manufacturer identifier, a manufacturing time, and a health index.

10. The method of claim 1, wherein the first energy storage device is positioned at a first location of the device-exchange station, and wherein the second energy storage device is positioned at a second location of the device-exchange station, and wherein the second location is a location closest to the first location among locations of the rest of the plurality of energy storage devices.

11. The method of claim 1, wherein the characteristic information includes a plurality of factors associated with the plurality of energy storage devices positioned in the device-exchange station, and wherein the method further comprises:
determining priorities of the plurality of factors based on user profile information associated with the request; and
selecting the first and second energy storage devices at least partially based on the priorities.

12. The method of claim 1, wherein the characteristic information includes a plurality of factors associated with the plurality of energy storage devices positioned in the device-exchange station, and wherein the method comprises:
determining weighting values of the plurality of factors based on user profile information associated with the request; and
selecting the first and second energy storage devices at least partially based on the weighting values.

13. A method for providing two energy storage devices positioned in a device-exchange station, the method comprising:
receiving a request, by the device-exchange station from a mobile device of a user, for retrieving two energy storage devices in the device-exchange station;
selecting, by the device-exchange station, a first energy storage device from a plurality of energy storage devices positioned in the device-exchange station based on characteristic information of each of the energy storage devices;
selecting, by the device-exchange station, a second energy storage device from the rest of the plurality of energy storage devices positioned in the device-exchange station based on the characteristic information of the first energy storage device and the rest of the plurality of energy storage devices; and
releasing, by the device-exchange station, the first and second energy storage devices,
wherein the first energy storage device has a first temperature, and wherein the second energy storage device has a second temperature, and before the step of releasing the first and second energy storage device, the method further comprises determining whether the first and second temperatures are lower than a temperature threshold.

14. The method of claim 13, wherein the temperature threshold is adjusted based on a direct current internal resistance (DCIR) of the first energy storage device or the second energy storage device.

15. The method of claim 13, further comprising adjusting the temperature threshold based on an ambient temperature of the device-exchange station.

16. The method of claim 13, further comprising:
receiving user profile information based on the request; and
adjusting the temperature threshold based on demographic information in the user profile or a vehicle type in the user profile.

17. A method for providing two energy storage devices positioned in a device-exchange station, the method comprising:
receiving a request, by the device-exchange station from a mobile device of a user, for retrieving two energy storage devices in the device-exchange station;
selecting, by the device-exchange station, a first energy storage device from a plurality of energy storage devices positioned in the device-exchange station based on a state of charge (SoC) of each of the energy storage devices of each of the energy storage devices, the first energy device having a highest SoC from the plurality of the energy storage devices;
comparing the highest SoC of the first energy storage device with the SoCs of the rest of the plurality of energy storage devices;
selecting, by the device-exchange station, a second energy storage device from the rest of the plurality of energy storage devices based on the comparison, wherein the second energy device has a second SoC, and wherein the second SoC is an SoC closest to the first SoC among the SoCs of the rest of the plurality of energy storage devices, wherein the second energy storage device is selected at least partially based on a location of the selected first energy storage device, and wherein the location is determined based on a location optimization process; and
releasing, by the device-exchange station, the first and second energy storage device.

18. The method of claim 17, further comprising:
determining whether the SoCs of the first energy storage device and the second energy storage device are higher than an SoC threshold.

* * * * *